United States Patent
Hirasawa

(10) Patent No.: US 9,491,874 B2
(45) Date of Patent: Nov. 8, 2016

(54) DISPLAY APPARATUS
(71) Applicant: Sony Corporation, Tokyo (JP)
(72) Inventor: Takeaki Hirasawa, Tokyo (JP)
(73) Assignee: Sony Corporation (JP)
( * ) Notice: Subject to any disclaimer, the term of this patent is extended or adjusted under 35 U.S.C. 154(b) by 178 days.

(21) Appl. No.: 13/783,703
(22) Filed: Mar. 4, 2013
(65) Prior Publication Data
 US 2013/0242483 A1 Sep. 19, 2013

(30) Foreign Application Priority Data
 Mar. 13, 2012 (JP) ................. 2012-056252

(51) Int. Cl.
 *G02F 1/1333* (2006.01)
 *H05K 5/02* (2006.01)
 *G02B 27/28* (2006.01)
 *H05K 5/00* (2006.01)
 *G02F 1/1335* (2006.01)

(52) U.S. Cl.
 CPC ........... *H05K 5/0217* (2013.01); *G02B 27/28* (2013.01); *G02F 1/133308* (2013.01); *H05K 5/0017* (2013.01); *G02F 1/133528* (2013.01); *G02F 2001/133314* (2013.01); *G02F 2201/46* (2013.01)

(58) Field of Classification Search
 CPC ........... G02B 27/28; H05K 5/0017; H05K 5/00217; G02F 2001/133311; G02F 1/133308; G02F 1/133528; G02F 2201/46; G02F 2001/133314
 See application file for complete search history.

(56) References Cited

U.S. PATENT DOCUMENTS

| | | | | |
|---|---|---|---|---|
| 4,597,635 A * | 7/1986 | Hoshikawa | ....... | G02F 1/133305 349/139 |
| 5,207,493 A * | 5/1993 | Murase | ........ | G02B 6/0043 362/297 |
| 6,538,709 B1 | 3/2003 | Kurihara et al. | | |
| 7,339,635 B2 * | 3/2008 | Freking | ....... | B29C 65/5042 349/115 |
| 7,466,379 B2 * | 12/2008 | Sakata | ........ | G06F 1/1601 349/106 |
| 7,626,809 B2 * | 12/2009 | Tai | ........ | G02F 1/133308 361/679.21 |
| 7,683,980 B2 * | 3/2010 | Ohta | ........ | G02F 1/133602 349/58 |
| 7,924,365 B2 * | 4/2011 | Takata | ......... | G02F 1/133608 349/56 |
| 2007/0030420 A1 * | 2/2007 | Jang | ........ | G02F 1/133528 349/96 |
| 2007/0146580 A1 * | 6/2007 | Ishitani | ........ | G02B 5/3025 349/96 |

(Continued)

FOREIGN PATENT DOCUMENTS

CN 201383058 Y 1/2010
CN 102662256 9/2012

(Continued)

OTHER PUBLICATIONS

European Search Report from EP Application No. 13154745, dated May 27, 2013.

(Continued)

*Primary Examiner* — Xanthia C Cunningham
(74) *Attorney, Agent, or Firm* — Lerner, David, Littenberg, Krumholz & Mentlik, LLP

(57) ABSTRACT

There is provided a display apparatus including a display that has a display face on which an image is displayed, a back chassis that is disposed on a side opposite to the display face of the display, and a cover film that is positioned in a state in which the cover film reaches the back chassis from the display face, one end of the cover film being attached to at least a portion of an outer circumferential portion of the display. The display is held by the cover film.

3 Claims, 25 Drawing Sheets

(56) References Cited

U.S. PATENT DOCUMENTS

| | | |
|---|---|---|
| 2007/0206123 A1 | 9/2007 | Hsieh et al. |
| 2009/0141209 A1* | 6/2009 | Chen et al. ................... 349/58 |
| 2009/0153783 A1* | 6/2009 | Umemoto .............. G02B 27/28 349/96 |
| 2010/0045888 A1* | 2/2010 | Naritomi .......... G02F 1/133608 349/58 |
| 2010/0213836 A1* | 8/2010 | Liao .......................... G09F 9/33 313/513 |
| 2010/0265425 A1 | 10/2010 | Kawaguchi et al. |
| 2010/0283935 A1 | 11/2010 | Park et al. |
| 2010/0315570 A1* | 12/2010 | Mathew ................ G06F 1/1637 349/58 |
| 2011/0109834 A1* | 5/2011 | Itoh ...................... G02B 6/0021 349/61 |
| 2011/0164210 A1* | 7/2011 | Tsuda ................. H01L 51/5281 349/96 |
| 2011/0229730 A1* | 9/2011 | Yosomiya ............... B32B 27/08 428/500 |
| 2011/0260612 A1* | 10/2011 | Lee .......................... H01J 11/10 313/635 |
| 2012/0113369 A1* | 5/2012 | Kim .......................... G09F 3/10 349/122 |
| 2012/0133859 A1* | 5/2012 | Cha .................... G02F 1/133528 349/61 |
| 2012/0281383 A1* | 11/2012 | Hwang ............. G02F 1/133308 361/807 |
| 2013/0076704 A1* | 3/2013 | Song ...................... G02B 27/26 345/204 |
| 2013/0155585 A1* | 6/2013 | Kim ..................... H05K 5/0221 361/679.01 |
| 2014/0368765 A1* | 12/2014 | Kim ................. G02F 1/133608 349/60 |

FOREIGN PATENT DOCUMENTS

| | | |
|---|---|---|
| JP | 2004-157471 A | 6/2004 |
| JP | 2005049450 A | 2/2005 |

OTHER PUBLICATIONS

Chinese Office Action for Application No. 201310071259.0 dated Aug. 19, 2016.

* cited by examiner

1 ··· DISPLAY APPARATUS
5 ··· REAR COVER
22 ··· COVER FILM

3 ··· BACK CHASSIS
4 ··· DISPLAY
4a ··· DISPLAY FACE
4b ··· OUTER CIRCUMFERENTIAL FACE
4c ··· OUTER CIRCUMFERENTIAL PORTION
5 ··· REAR COVER
10 ··· FIRST POLARIZING FILM
10a ··· OUTER CIRCUMFERENTIAL FACE
12 ··· PROTECTIVE MEMBER
20 ··· CIRCUIT BOARD
22 ··· COVER FILM
22a ··· ONE END FACE

12 ··· PROTECTIVE MEMBER
22 ··· COVER FILM

3 ··· BACK CHASSIS
4 ··· DISPLAY
4a ··· DISPLAY FACE
4b ··· OUTER CIRCUMFERENTIAL FACE
4c ··· OUTER CIRCUMFERENTIAL PORTION
10 ··· FIRST POLARIZING FILM
12 ··· PROTECTIVE MEMBER
22 ··· COVER FILM

4 ··· DISPLAY
4b ··· OUTER CIRCUMFERENTIAL FACE
4c ··· OUTER CIRCUMFERENTIAL PORTION
22 ··· COVER FILM

3 ··· BACK CHASSIS
12 ··· PROTECTIVE MEMBER
22 ··· COVER FILM

3 ··· BACK CHASSIS
20 ··· CIRCUIT BOARD
22 ··· COVER FILM

- 3 ··· BACK CHASSIS
- 4 ··· DISPLAY
- 4a ··· DISPLAY FACE
- 4b ··· OUTER CIRCUMFERENTIAL FACE
- 4c ··· OUTER CIRCUMFERENTIAL PORTION
- 10 ··· FIRST POLARIZING FILM
- 12 ··· PROTECTIVE MEMBER
- 22 ··· COVER FILM

| | |
|---|---|
| 3 | BACK CHASSIS |
| 4 | DISPLAY |
| 4a | DISPLAY FACE |
| 4b | OUTER CIRCUMFERENTIAL FACE |
| 4c | OUTER CIRCUMFERENTIAL PORTION |
| 10 | FIRST POLARIZING FILM |
| 10a | OUTER CIRCUMFERENTIAL FACE |
| 12 | PROTECTIVE MEMBER |
| 22 | COVER FILM |
| 25 | REINFORCING FILM |

3 ··· BACK CHASSIS
4 ··· DISPLAY
4a ··· DISPLAY FACE
4b ··· OUTER CIRCUMFERENTIAL FACE
4c ··· OUTER CIRCUMFERENTIAL PORTION
10 ··· FIRST POLARIZING FILM
10a ··· OUTER CIRCUMFERENTIAL FACE
12 ··· PROTECTIVE MEMBER
22 ··· COVER FILM

3 · · · BACK CHASSIS
4 · · · DISPLAY
4a · · · DISPLAY FACE
4b · · · OUTER CIRCUMFERENTIAL FACE
4c · · · OUTER CIRCUMFERENTIAL PORTION
10 · · · FIRST POLARIZING FILM
10a · · · OUTER CIRCUMFERENTIAL FACE
12 · · · PROTECTIVE MEMBER
22 · · · COVER FILM
22a · · · ONE END FACE

3 ··· BACK CHASSIS
12 ··· PROTECTIVE MEMBER
22B ··· COVER FILM

3 ··· BACK CHASSIS
12 ··· PROTECTIVE MEMBER
22C ··· COVER FILM

3 ··· BACK CHASSIS
12 ··· PROTECTIVE MEMBER
22C ··· COVER FILM

3 ··· BACK CHASSIS
12 ··· PROTECTIVE MEMBER
22C ··· COVER FILM

3 ··· BACK CHASSIS
12 ··· PROTECTIVE MEMBER
22C ··· COVER FILM

DISPLAY APPARATUS

CROSS-REFERENCE TO RELATED APPLICATION

The present application claims priority from Japanese Patent Application No. JP 2012-056252 filed in the Japanese Patent Office on Mar. 13, 2012, the entire content of which is incorporated herein by reference.

BACKGROUND

The present technology relates to a technical field of a display apparatus. Specifically, the present technology relates to a technical field which aims to make a small and lightweight display in such a way that a cover film is attached to the outer circumferential portion of the display so as to hold the display.

A display having a display face on which images are displayed is provided in a display apparatus such as a television receiver set, or a personal computer.

In such a display apparatus, there is a display of which a back chassis is disposed on the rear surface side thereof, and the outer circumferential portion of the display is held by a frame body which is called a bezel so that the frame body is mounted on the back chassis (For example, refer to JP 2004-157471A).

The outer circumferential portion of the display is held by being fixed to the frame body using, for example, fixing with screws, or the like.

SUMMARY

In the display apparatus disclosed in JP 2004-157471A, however, since the display is held by the frame body, the presence of the frame body increases the outer size and thereby seriously hinders miniaturization of the outer shape thereof.

In addition, the presence of the frame body causes the overall weight thereof to increase, which also hinders lightening of the weight thereof.

Thus, it is desirable to provide the display apparatus capable of attaining a small size and a light weight thereof.

First, there is provided a display apparatus including a display that has a display face on which images are displayed, a back chassis that is disposed on the opposite side to the display face of the display, and a cover film of which one end is attached to at least one portion of an outer circumferential portion of the display in a state in which the cover film reaches the back chassis side from the display face side, and the display is held by the cover film.

Thus, in the display apparatus, the display is held by the cover film that is attached to the outer circumferential portion of the display.

Second, in the above-described display apparatus, it is desirable that at least another end of the cover film be attached to the back chassis.

By attaching at least another end of the cover film to the back chassis, the display and the back chassis are linked to each other via the cover film.

Third, in the display apparatus, it is desirable that a circuit board and a rear cover that covers the circuit board be mounted on the back chassis, and a portion of the cover film that is attached to the back chassis be pressed by the rear cover.

By mounting the circuit board and the rear cover that closes the circuit board on the back chassis, and pressing the portion of the cover film that is attached to the back chassis with the rear cover, a member dedicated to pressing of the cover film is unnecessary.

Fourth, in the display apparatus, it is desirable that the display be provided with a display panel and a polarizing film attached to a surface of the display panel, and the polarizing film be used as the cover film.

By providing the display panel and the polarizing film attached to the surface of the display panel in the display, and using the polarizing film as the cover film, it is not necessary to attach the cover film dedicated to holding of the display.

Fifth, in the display apparatus, it is desirable that a protective member that covers at least one portion of an outer circumferential face of the display be provided, and the cover film be attached to an outer face of the protective member.

By providing the protective member that covers at least one portion of the outer circumferential face of the display, and attaching the cover film to the outer face of the protective member, the cover film is attached thereto in the state in which the outer circumferential portion of the display is protected.

Sixth, in the display apparatus, it is desirable that the display be provided with a display panel and a polarizing film attached to a surface of the display panel, and one end of the cover film be attached to at least a portion of an outer circumferential portion of the polarizing film.

By providing the display panel and the polarizing film attached to the surface of the display panel in the display, and attaching one end of the cover film to at least a portion of the outer circumferential portion of the polarizing film, the polarizing film is pressed by the cover film.

Seventh, in the display apparatus, it is desirable that the display be provided with a display panel and a polarizing film attached to a surface of the display panel, and one end face of the cover film and at least a portion of an outer circumferential face of the polarizing film abut each other.

By providing the display panel and the polarizing film attached to the surface of the display panel in the display, and causing one end face of the cover film and at least a portion of the outer circumferential face of the polarizing film to abut each other, the cover film is not superimposed on the polarizing film.

Eighth, in the display apparatus, it is desirable that a reinforcing film be attached to the cover film.

By attaching the reinforcing film to the cover film, strength of the cover film is reinforced by the reinforcing film.

According to an embodiment of the present disclosure, there is provided a display apparatus including a display that has a display face on which an image is displayed, a back chassis that is disposed on a side opposite to the display face of the display, and a cover film that is positioned in a state in which the cover film reaches the back chassis from the display face, one end of the cover film being attached to at least a portion of an outer circumferential portion of the display. The display is held by the cover film.

Thus, it is not necessary to provide a frame body which is called a bezel to hold the display, and thus the outer shape and weight decrease, and miniaturization and light weight can be attained.

According to an embodiment of the present disclosure, at least another end of the cover film may be attached to the back chassis.

Thus, the display and the back chassis are linked via the cover film, and accordingly, the display can be easily and reliably held by the cover film.

According to an embodiment of the present disclosure, a circuit board and a rear cover that closes the circuit board may be mounted on the back chassis, and a portion of the cover film that is attached to the back chassis may be pressed by the rear cover.

Thus, since the cover film is pressed by the rear cover which is a member necessary in advance for closing the circuit board, detachment of the cover film can be prevented without causing an increase in the number of components.

According to an embodiment of the present disclosure, the display may be provided with a display panel and a polarizing film attached to a surface of the display panel, and the polarizing film may be used as the cover film.

Thus, since the cover film dedicated to holding of the display is not necessary to be attached thereto 22, further miniaturization, light weight, reduction in material costs and manufacturing costs of the display apparatus can be attained.

According to an embodiment of the present disclosure, a protective member that covers at least a portion of an outer circumferential face of the display may be provided. The cover film may be attached to an outer face of the protective member.

Thus, the display can be held by the cover film in the state in which the outer circumferential portion of the display is protected.

According to an embodiment of the present disclosure, the display may be provided with a display panel and a polarizing film attached to a surface of the display panel. One end of the cover film may be attached to at least a portion of an outer circumferential portion of the polarizing film.

Thus, the polarizing film is pressed by the cover film, and accordingly, detachment of the polarizing film can be prevented.

According to an embodiment of the present disclosure, the display may be provided with a display panel and a polarizing film attached to a surface of the display panel. At least a portion of an outer circumferential face of the polarizing film may abut one end face of the cover film.

Thus, since the cover film is not superimposed on the polarizing film, further miniaturization and light weight of the display apparatus can be attained.

According to an embodiment of the present disclosure, a reinforcing film may be attached to the cover film.

Thus, breakage, damage, and detachment of the cover film can be prevented.

DETAILED DESCRIPTION OF THE EMBODIMENT

Figure 1:
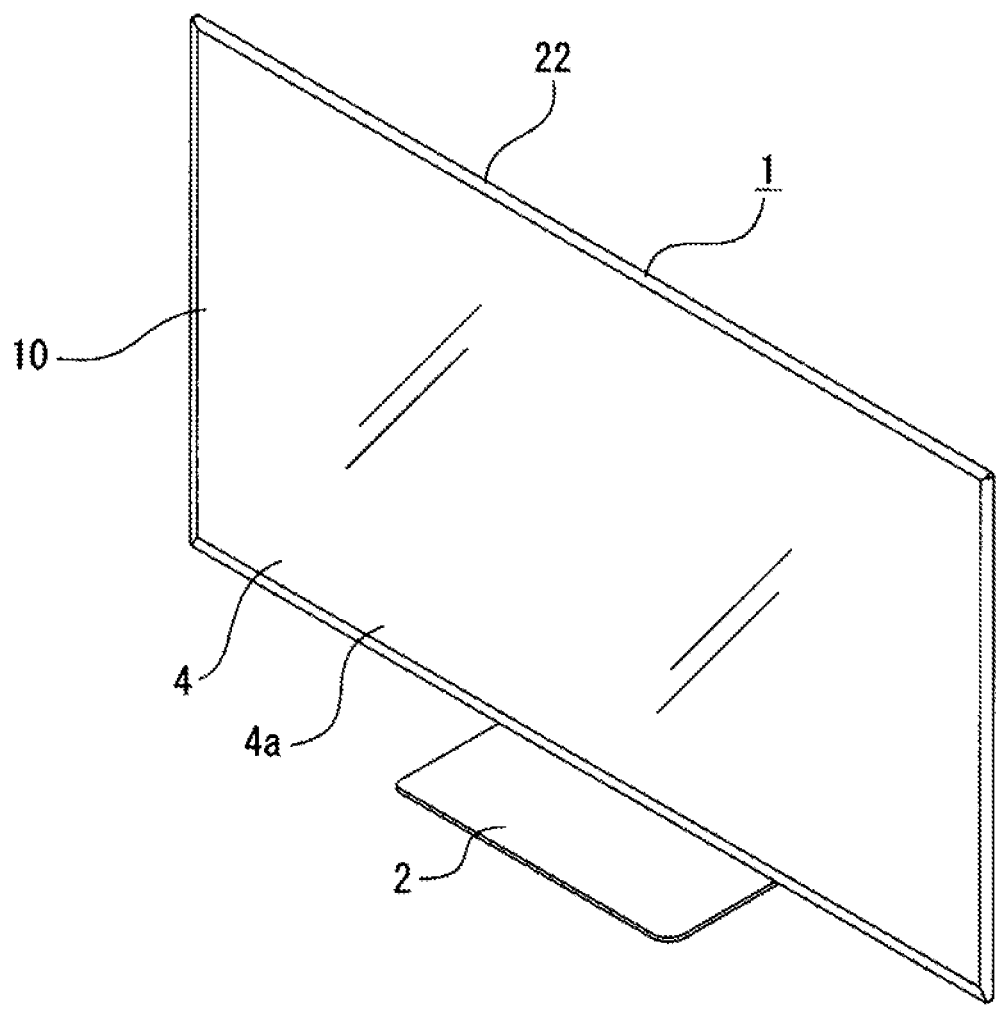
FIG. 1, along with FIGS. 2 to 27, is a diagram showing a display apparatus according to an embodiment of the present technology, and the present drawing is a perspective view of the display apparatus.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

In the embodiment to be shown below, the display apparatus of the present technology is applied to a television receiver set of which a liquid crystal panel displays images.

Note that the application scope of the present technology is not limited to a television receiver set having a liquid crystal display, and the present technology can be widely applied to various kinds of display apparatuses such as other types of television receiver sets, and monitors used in personal computers, and the like regardless of the type of a display.

[Configuration of a Display Apparatus]

Figure 2:
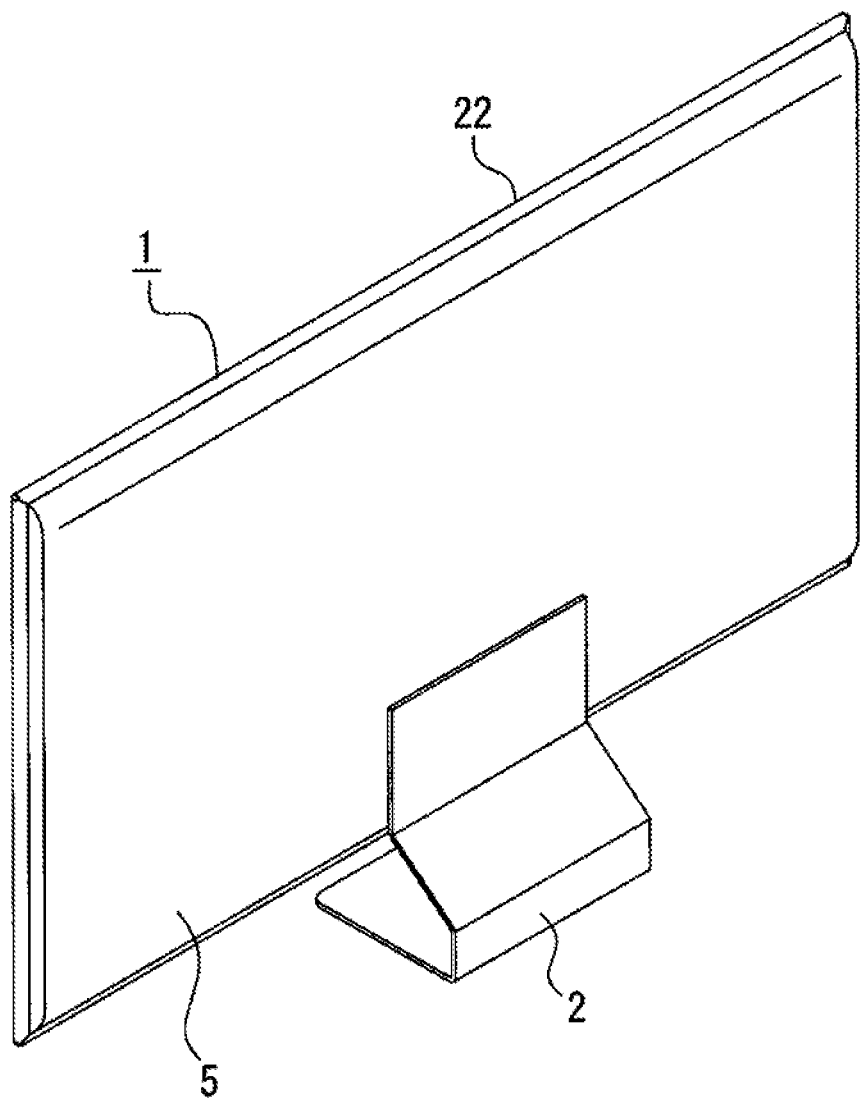
FIG. 2 is a perspective view showing the display apparatus as viewed from the opposite side to that of the FIG. 1.
Figure 3:
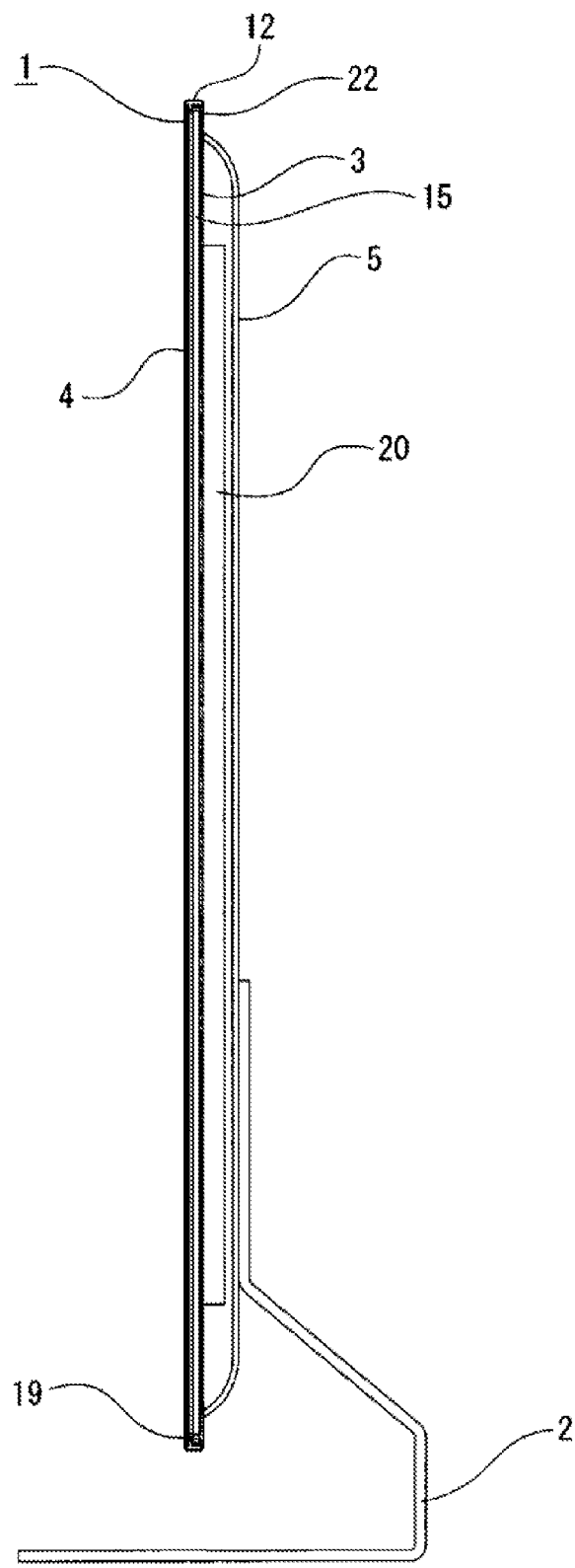
FIG. 3 is a schematic cross-sectional view of the display apparatus.

A display apparatus (television receiver set) 1 is formed in, for example, a substantially flat rectangular shape which is horizontally long and held by a stand 2 (refer to FIGS. 1 to 3).

The display apparatus 1 includes a back chassis 3, a display 4, and a rear cover 5.

Figure 4:
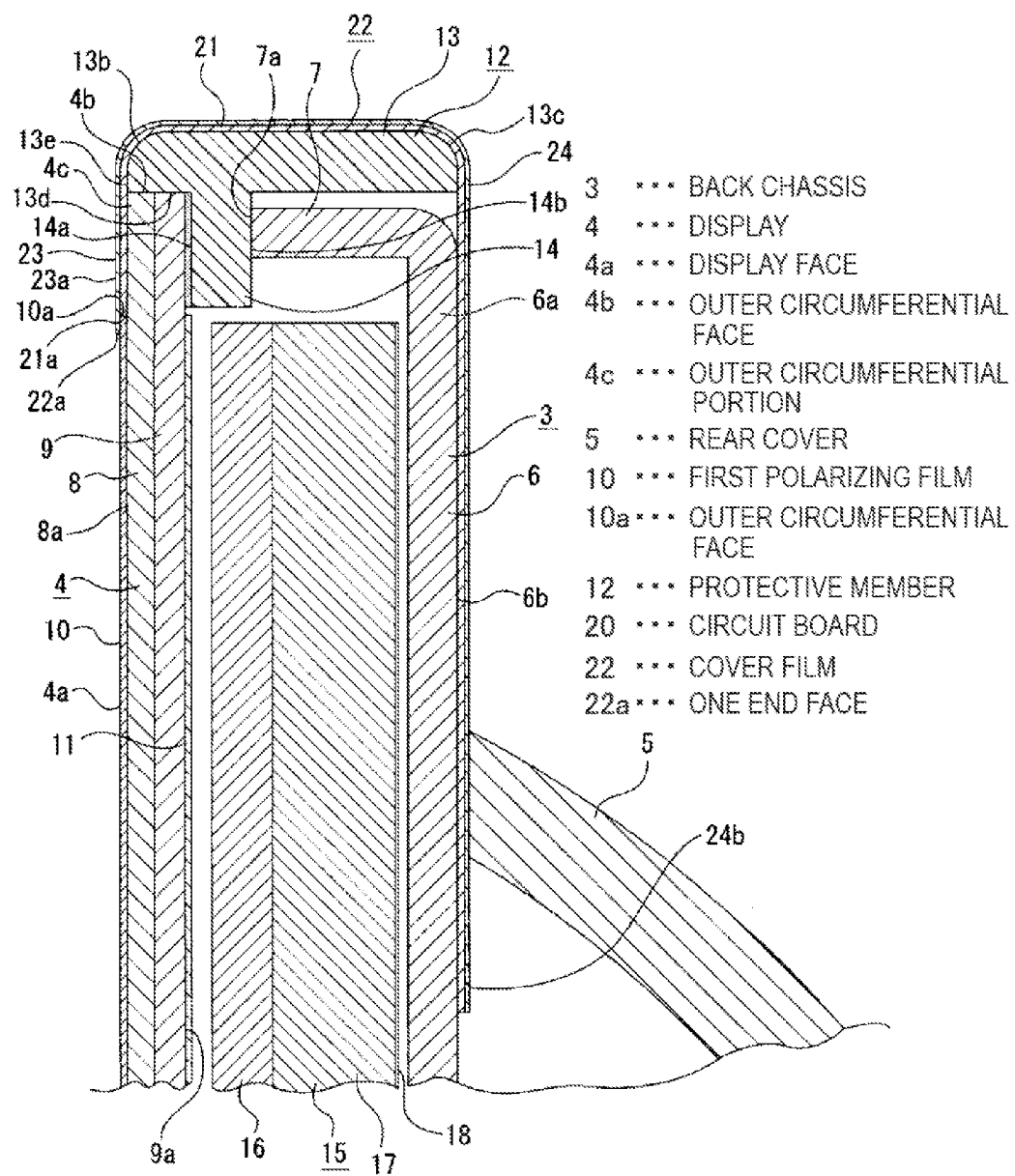
FIG. 4 is an enlarged cross-sectional view showing the portion on the upper end side of the display apparatus.
Figure 5:
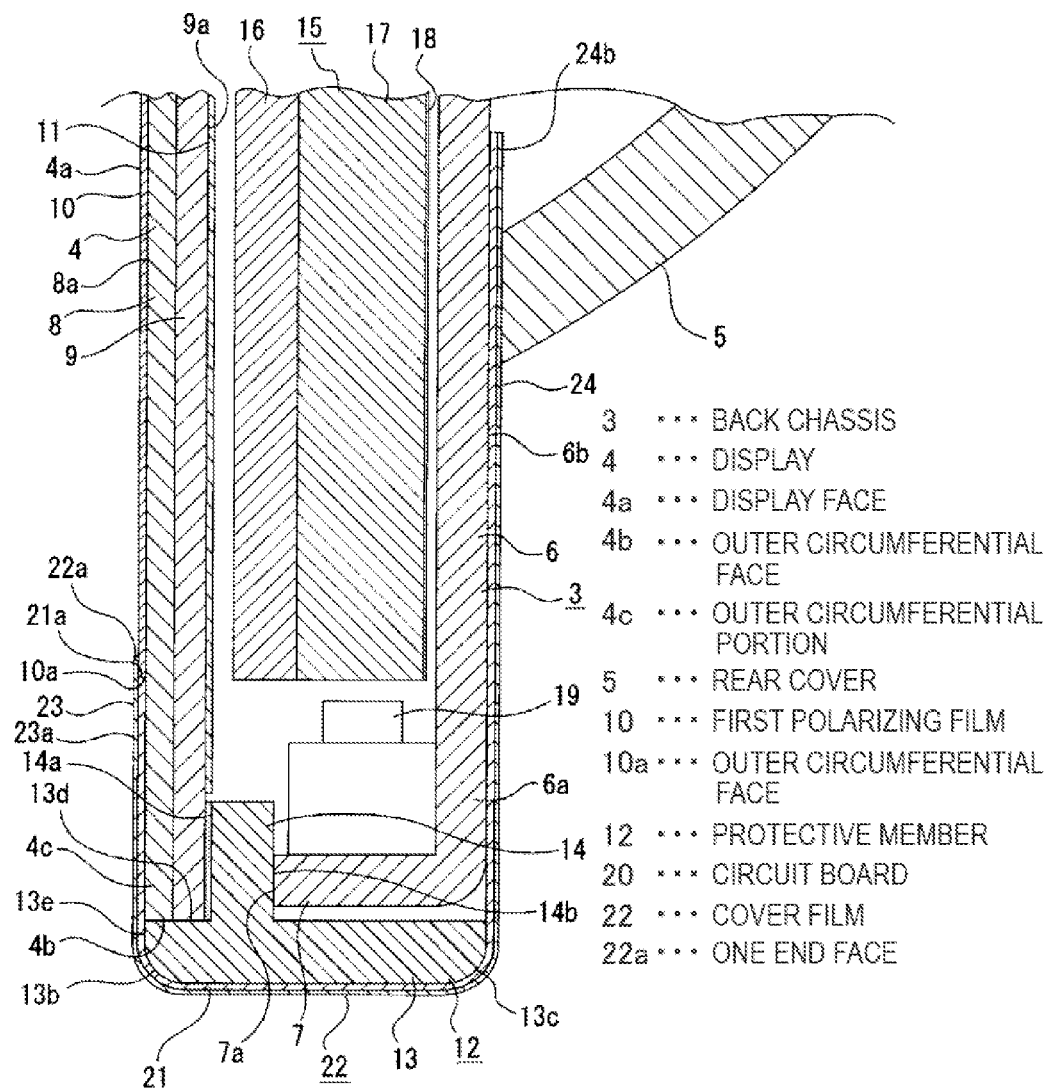
FIG. 5 is an enlarged cross-sectional view showing the portion on the lower end side of the display apparatus.

The back chassis 3 has a base face portion 6 which faces the front and rear directions and a circumferential face portion 7 which protrudes frontward from an outer circumferential portion 6a of the base face portion 6 (refer to FIGS. 4 and 5).

The display 4 is, for example, a liquid crystal display, the front face thereof is set to be a display face 4a, and has a first transparent plate 8 and a second transparent plate 9 which are disposed front and back, a first polarizing film 10 which is attached to a front face 8a of the first transparent plate 8, and a second polarizing film 11 which is attached to a rear face 9a of the second transparent plate 9.

The display 4 is disposed on the front side of the back chassis 3, and various elements such as a transparent electrode, a liquid crystal, alignment layers, and color filters for displaying images which are not shown in the drawings are disposed in the display 4.

Both of the first and second polarizing films 10 and 11 are attached in the image display region, and respectively disposed in portions other than outer circumferential portions of each of the first and second transparent plates 8 and 9.

The display 4 is fixed to a protective member 12. The protective member 12 is formed like a frame, and has a base portion 13 and a mounting portion 14 inwardly projecting from an inner face of the base portion 13. Outer faces of four corner parts 13a, 13a, . . . of the base portion 13, front ends 13b of the outer circumferential face, and rear ends 13c of the outer circumferential face respectively form curved faces which are outwardly convex.

The display 4 is attached to a front face 14a of the mounting portion 14 in the protective member 12 using, for example, adhesion. In the display 4, the outer circumferential portion of a rear face 9a of the second transparent plate 9 adheres to the front face 14a of the mounting portion 14.

In the state in which the display 4 is mounted on the protective member 12, an outer circumferential portion 4c of the display 4 is protected in such a way of holding the display 4 using the protective member 12 by bringing the front end 13d on the inner circumferential face of the base portion 13 into contact with the an outer circumferential face 4b of the display 4, or by inserting another member so as to be disposed in proximity to the extent that the member does not damage the display 4. Thus, the protective member 12 functions as an edge guard which protects the outer circumferential portion 4c of the display 4.

In the state in which the display 4 is mounted on the protective member 12, a front face 13e of the base portion 13 of the protective member 12 and a front face 8a of the first transparent plate 8 are positioned on the same plane or adjacent planes.

A rear face 14b of the mounting portion 14 of the protective member 12 is pushed by a front face 7a of the circumferential face portion 7 in the back chassis 3. At this moment, the back chassis 3 may be mounted on the protective member 12 by adhering the rear face 14b to the front face 7a, or the like.

An optical control body 15 is disposed between the back chassis 3 and the display 4. The optical control body 15 is constituted by a control sheet portion 16, a light guide plate 17, and a reflective sheet 18 which are laminated in order from the front side.

The control sheet portion 16 is formed such that a plurality of optical sheets having various functions are laminated, and each of the optical sheets has a function such as a light diffusion function, control of light in the traveling direction, and the like. With the control sheet portion 16, evenness and improvement in luminance, and the like are attained.

The light guide plate 17 has a function of guiding light emitted from a light source to be described later so that the light is incident to the display 4 via the control sheet portion 16.

The reflective sheet 18 has a function that aims to enhance luminance by causing light guided by the light guide plate 17 to be reflected thereon to the control sheet portion 16 side.

Light sources 19, 19, . . . are disposed right below the light guide plate 17 so as to be separated on the right and left sides (refer to FIG. 5). For example, LEDs (Light Emitting Diodes) are used as the light sources 19, 19, . . . , and light emitted from the light sources 19 is incident into the light guide plate 17 from the bottom face.

On a rear face 6b of the base face portion 6 in the back chassis 3, circuit boards 20 and 20 are mounted so as to be separated on the right and left sides (refer to FIG. 3). The circuit boards 20 and 20 function as control circuits which supply currents to transparent electrodes of the display 4, supply driving currents to the light sources 19, 19, . . . , and the like, and control the overall display apparatus 1.

A rear cover 5 is formed in a low box shape of which the front side is open, and mounted on the rear face 6b of the base face portion 6 by being screwed, or the like. The circuit boards 20 and 20 are closed by the rear cover 5.

An auxiliary film 21 is attached to the position from the outer circumferential portion 4c of the display 4 to the outer circumferential portion 6a of the base face portion 6 in the back chassis 3 (refer to FIGS. 4 and 5). For example, an adhesive is applied to the face of auxiliary film 21 to be attached so as to attach the display 4, the base face portion 6, and the like thereto using the adhesive.

The auxiliary film 21 is formed of a material which is excellent in flexibility and has a high mechanical strength. The thickness of the auxiliary film 21 is, for example, the same as that of the first polarizing film 10, and one end thereof is attached to the front face 8a of the first transparent plate 8 in a state in which one end face 21a and the outer circumferential face 10a of the first polarizing film 10 abut each other. The other end of the auxiliary film 21 is attached to the outer circumferential portion 6a of the rear face 6b of the base face portion 6, and the intermediate portion thereof is attached to the outer face of the protective member 12.

A cover film 22 is attached to the position from the outer circumferential portion 4c of the display 4 to the outer circumferential portion 6a of the base face portion 6 in the back chassis 3 on the outer face side of the auxiliary film 21. For example, an adhesive is applied to the face of cover film 22 to be attached so as to attach the display 4, the base face portion 6, and the like thereto using the adhesive.

The cover film 22 is formed of a material which is excellent in flexibility, for example triacetylcellulose (TAC), polyethylene terephthalate, polycarbonate, an acrylic resin, or the like. In addition, the cover film 22 may be formed of a material having a low reflecting property which suppresses reflection of light. Further, when the cover film 22 is attached to a portion or the whole of the display region of images, the cover film 22 may be formed of a material that does not cause degradation in image quality, for example, a material having high transparency.

Figure 6:
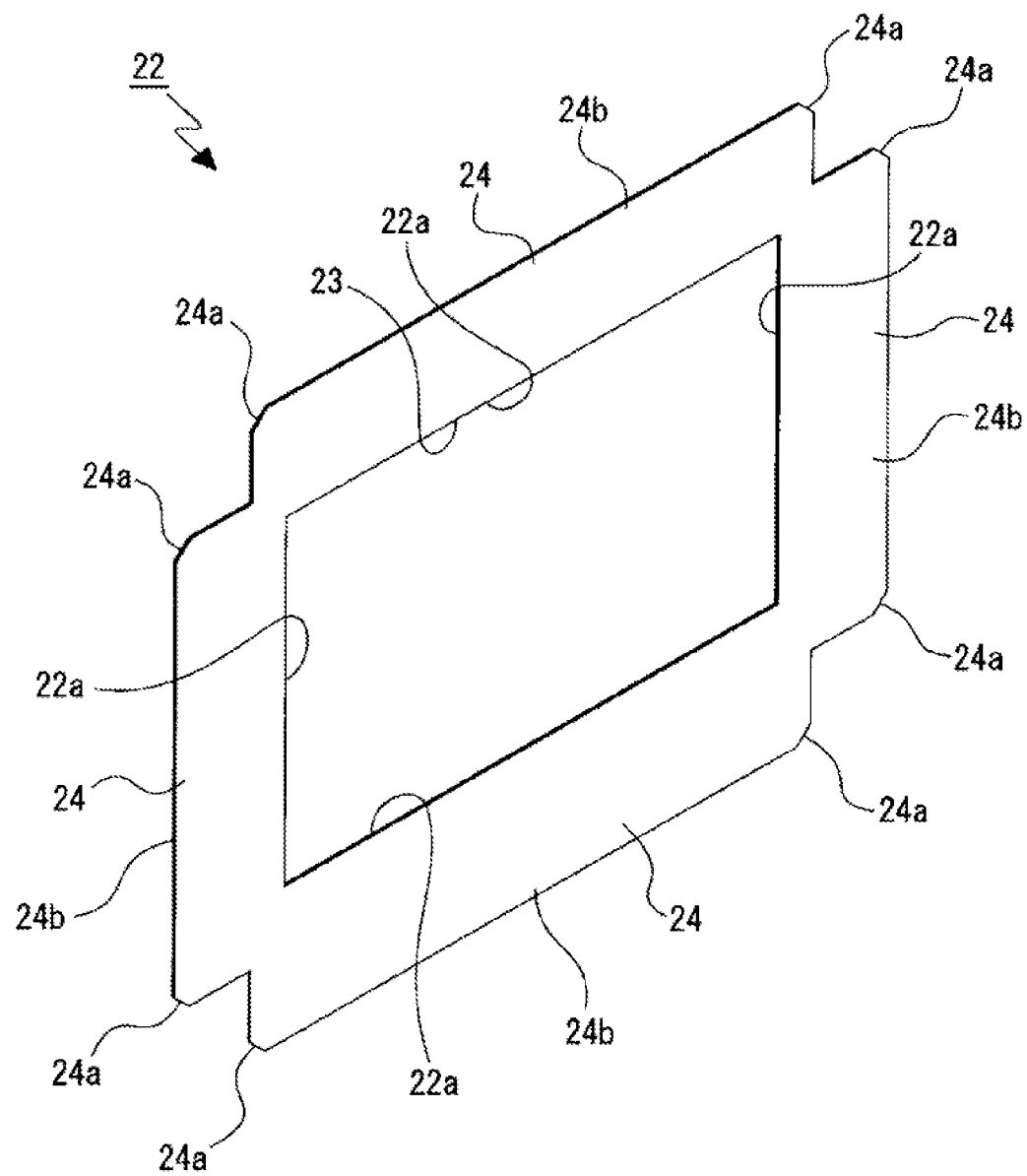
FIG. 6 is a perspective view of a cover film.

The cover film 22 is constituted by a front face attaching portion 23 which is formed in a rectangular frame shape that is horizontally long and protruding face portions 24, 24, . . . , which outwardly protrude from edges on both upper and lower sides and both right and left sides of the front face attaching portion 23 (refer to FIG. 6). In both the right and left ends and both the upper and lower ends in the outer sides of the protruding face portions 24, 24, . . . , inclined edges 24a, 24a, . . . which are inclined by 45° are formed.

The cover film 22 may be a rectangular film of which the inner side of the frame is transparent. In this case, since the display face 4a of the display 4 does not have a level difference with the cover film 22, enhancement in design can be attained.

Figure 7:
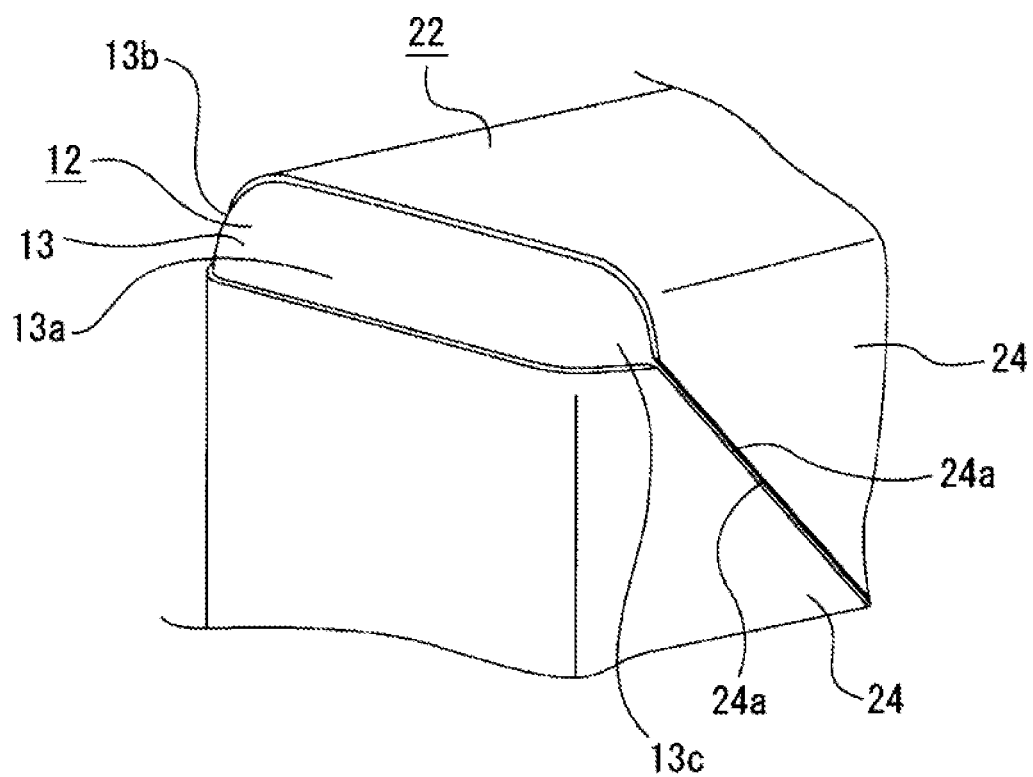
FIG. 7 is an enlarged perspective view showing a state of a corner part of a protective member in the state in which the cover film is attached to the apparatus.

The front face attaching portion 23 of the cover film 22 is attached to the outer circumferential portion 4c of the display 4, and the protruding face portions 24, 24, . . . are folded as if each of them reaches the back chassis 3 side so as to be attached to the outer face of the protective member 12 and the rear face 6b of the outer circumferential portion 6a of the base face portion 6 (refer to FIGS. 4, 5, and 7). Here, one end 23a of the front face attaching portion 23 on the inner circumferential side is attached to an outer circumferential portion of the first polarizing film 10.

Since the one end 23a of the front face attaching portion 23 of the cover film 22 is attached to the outer circumferential portion of the first polarizing film, the first polarizing film 10 is pressed by the cover film 22, and accordingly, detachment of the first polarizing film 10 from the first transparent plate 8 can be prevented.

In the state in which the cover film 22 is attached thereto, the inclined edges 24a and 24a of the protruding face portions 24 and 24 adjacent to each other on the back face side of the back chassis 3 are brought in proximity to or into contact with each other (refer to FIG. 7). At this moment, a gap is made between side edges of the adjacent protruding face portions 24 and 24, and accordingly, the four corner parts 13a, 13a, . . . of the protective member 12 are exposed.

The enhancement in design of the display apparatus 1 can be attained with regard to such exposure of the four corner parts 13a, 13a, . . . , of the protective member 12 in such a way that, for example, the protective member 12 is formed of a material having a similar texture and the same color as that of the cover film 22 so that the exposure is not noticed when viewed from outside.

Alternatively, the enhancement in design of the display apparatus 1 can be attained by forming the exposed four corner parts 13a, 13a, . . . , of the protective member 12 of a material having a different texture and color from that of the cover film 22 so that the exposure is conspicuous when viewed from outside and used as an accent in the design.

In addition, the enhancement in design of the display apparatus 1 can be attained by mounting caps which are not shown but close the end faces of the cover film 22 on the portions in which the four corner parts 13a, 13a, . . . , of the protective member 12 are exposed.

Further, the enhancement in design of the display apparatus 1 can be attained in such a way that the cover film 22 is formed of a material having elasticity, and in attaching work of the cover film 22, the cover film 22 is attached to the back face while being stretched using heat molding, vacuum molding, or the like so as not to expose the four corner parts 13a, 13a, . . . , of the protective member 12.

Note that, in the display apparatus 1, the auxiliary film 21 having the same thickness as the first polarizing film 10 is attached as described above, and the cover film 22 is attached to the auxiliary film 21 from the outside.

Thus, the enhancement in design of the display apparatus 1 can be attained without causing a level difference in the portion in which the outer circumferential face 10a of the first polarizing film 10 is positioned with the cover film 22 attached thereto.

In addition, in the state in which the cover film 22 is attached, ends 24b, 24b, . . . of the protruding face portions 24, 24, . . . on the outer side are pressed by the rear cover 5 (refer to FIGS. 4 and 5).

Thus, since the cover film 22 is pressed by the rear cover 5 which is a member necessary in advance in order to close the circuit boards 20 and 20, detachment of the cover film 22 can be prevented without causing an increase in the number of components.

Figure 8:
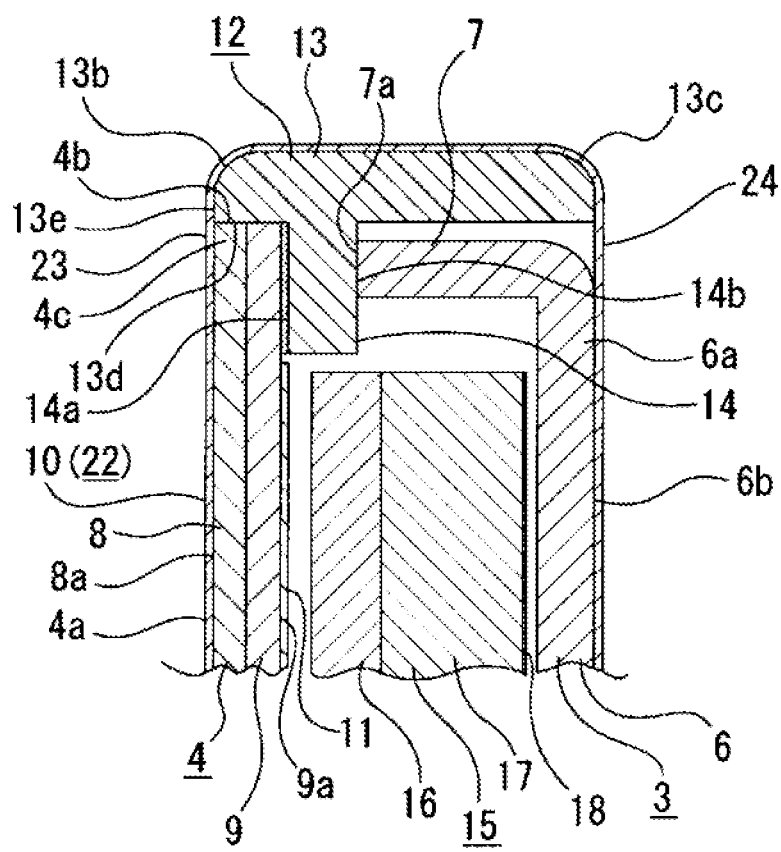
FIG. 8 is an enlarged cross-sectional view showing an example in which a first polarizing film is used as the cover film.

Note that, in the above description, the example in which the cover film 22 that is different from the first polarizing film 10 is attached to the apparatus has been shown, but for example, it is also possible to use the first polarizing film 10 as the cover film 22 by increasing the size of the first polarizing film 10 (refer to FIG. 8).

Since the cover film 22 dedicated to holding of the display 4 is not necessary to be attached thereto by using the first polarizing film 10 as the cover film 22, the display apparatus 1 can be further miniaturized and lightened in weight and manufacturing costs.

[Assembly of the Display Apparatus]

Hereinafter, an assembly order of the above-described display apparatus 1 will be described (refer to FIGS. 9 to 11). Note that, in the following assembly order, attachment of the auxiliary film 21 will be omitted.

Figure 9:
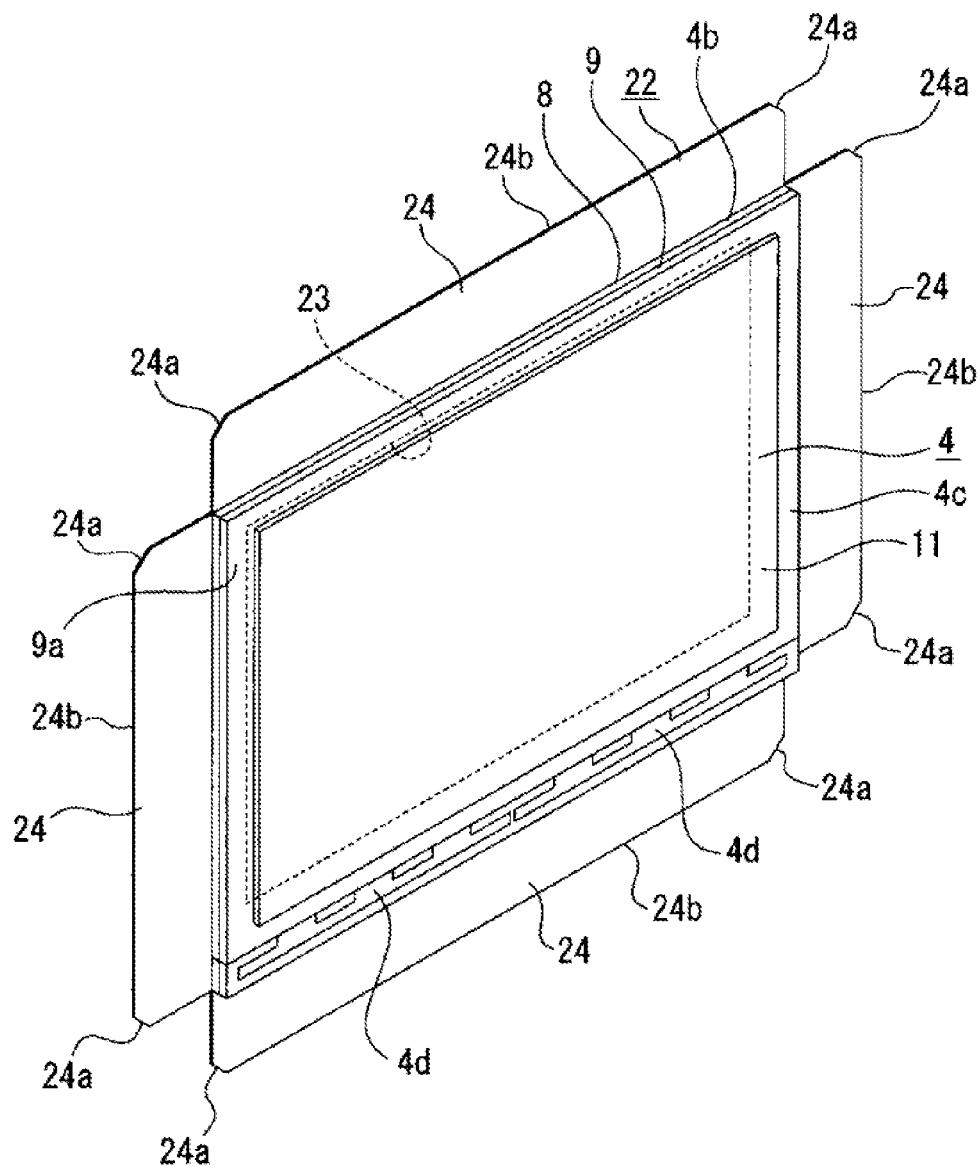
FIG. 9, along with FIGS. 10 to 13, is a diagram showing an assembly procedure of the display apparatus, and the present drawing is a schematic perspective view showing a state in which a front face attaching portion of the cover film is attached to a display.

First, the front face attaching portion 23 of the cover film 22 is attached to the outer circumferential portion 4c on the front face of the display 4 (refer to FIG. 9). Note that electrode parts 4*d* and 4*d* that serve as connection terminals for supplying driving currents to transparent electrodes, and the like are provided in the lower end of the display 4.

Figure 10:
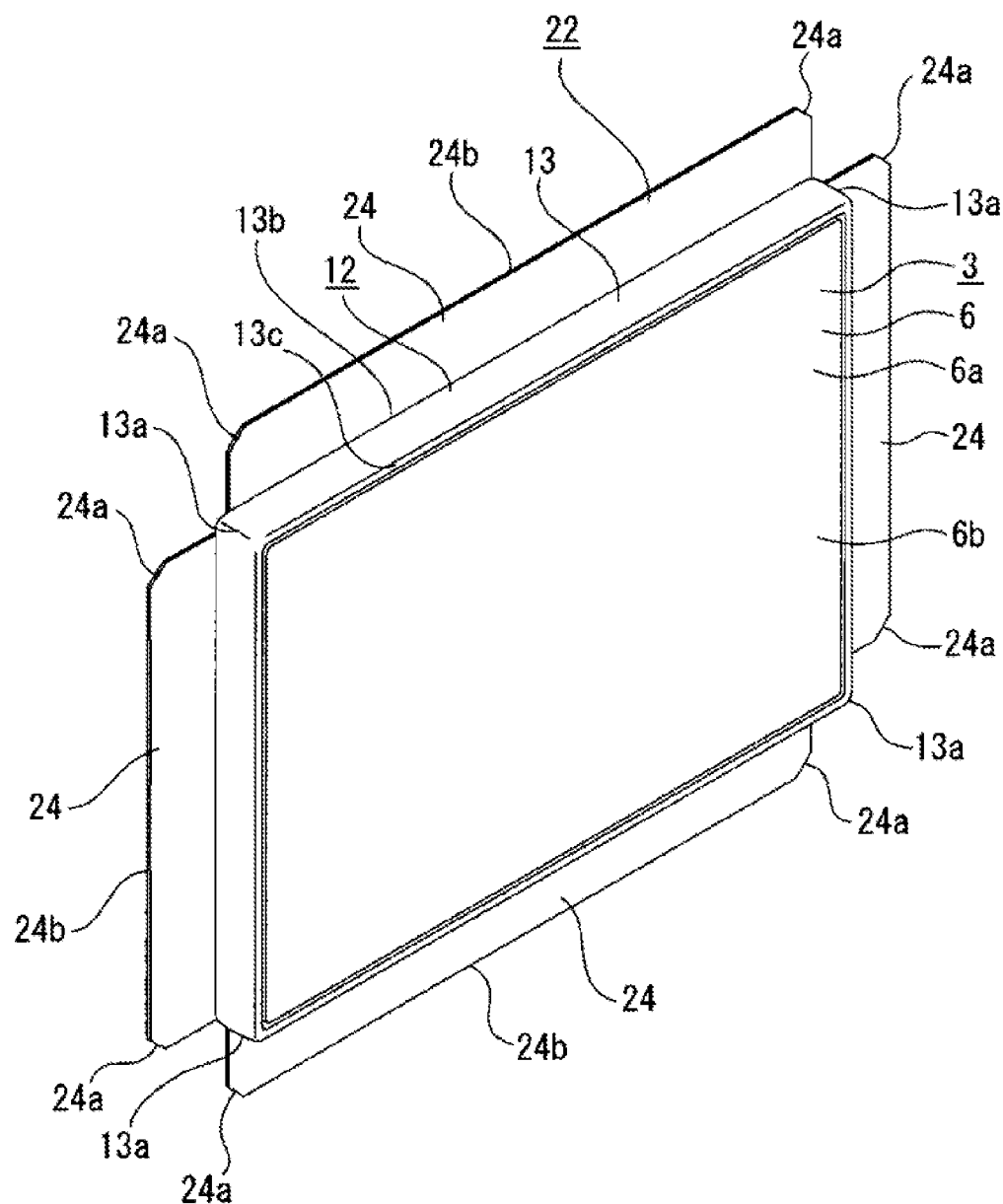
FIG. 10 is a schematic perspective view showing a state in which the protective member is attached to a back chassis.

Next, the outer circumferential portion 4*c* of the display 4 is mounted on the protective member 12, and the back chassis 3 is disposed in the back face side of the display 4 (refer to FIG. 10). At this moment, a light source unit not shown in the drawing in which the light sources 19, 19, . . . are disposed is disposed on the lower side of the display 4.

Figure 11:
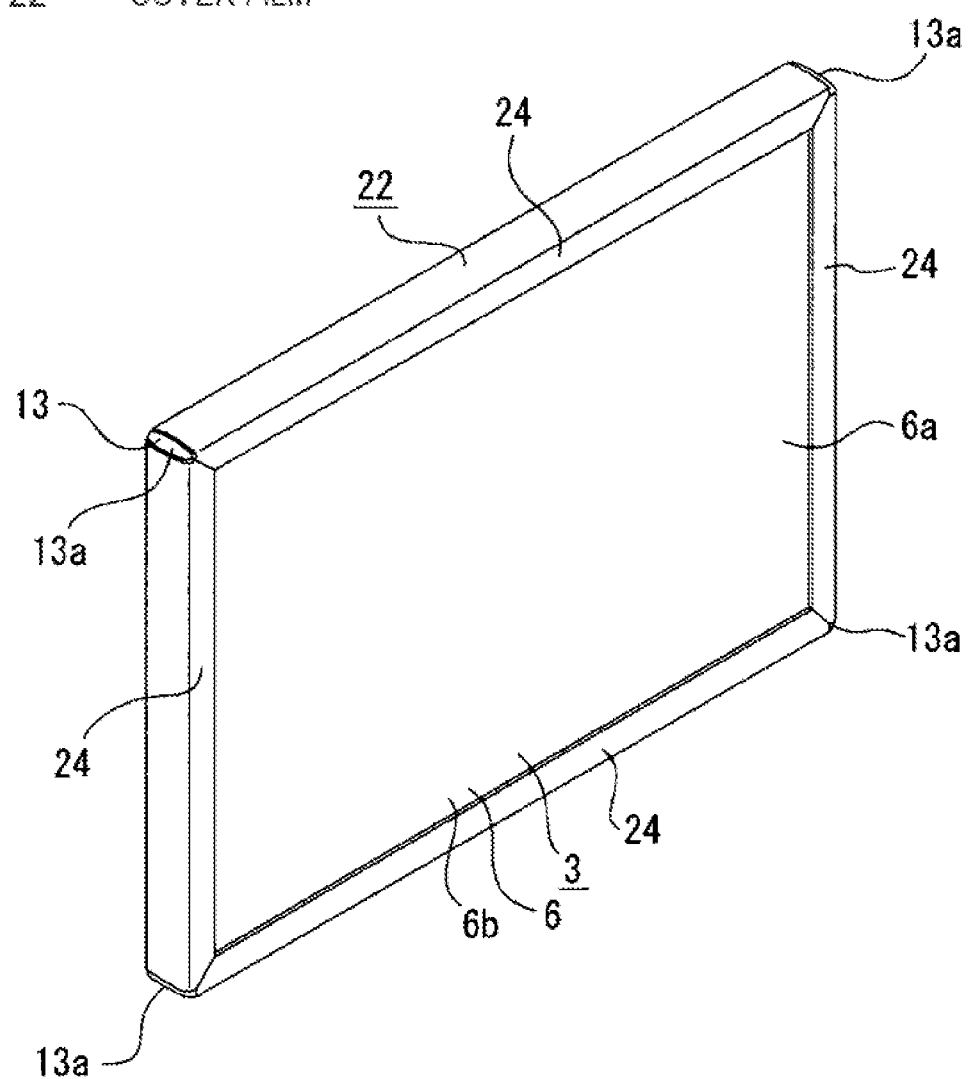
FIG. 11 is a schematic perspective view showing a state in which the cover film is folded and then attached to the protective member and the back chassis.

Next, the protruding face portions 24, 24, . . . of the cover film 22 are folded and then attached to the protective member 12 and the back chassis 3 (refer to FIG. 11).

Figure 12:
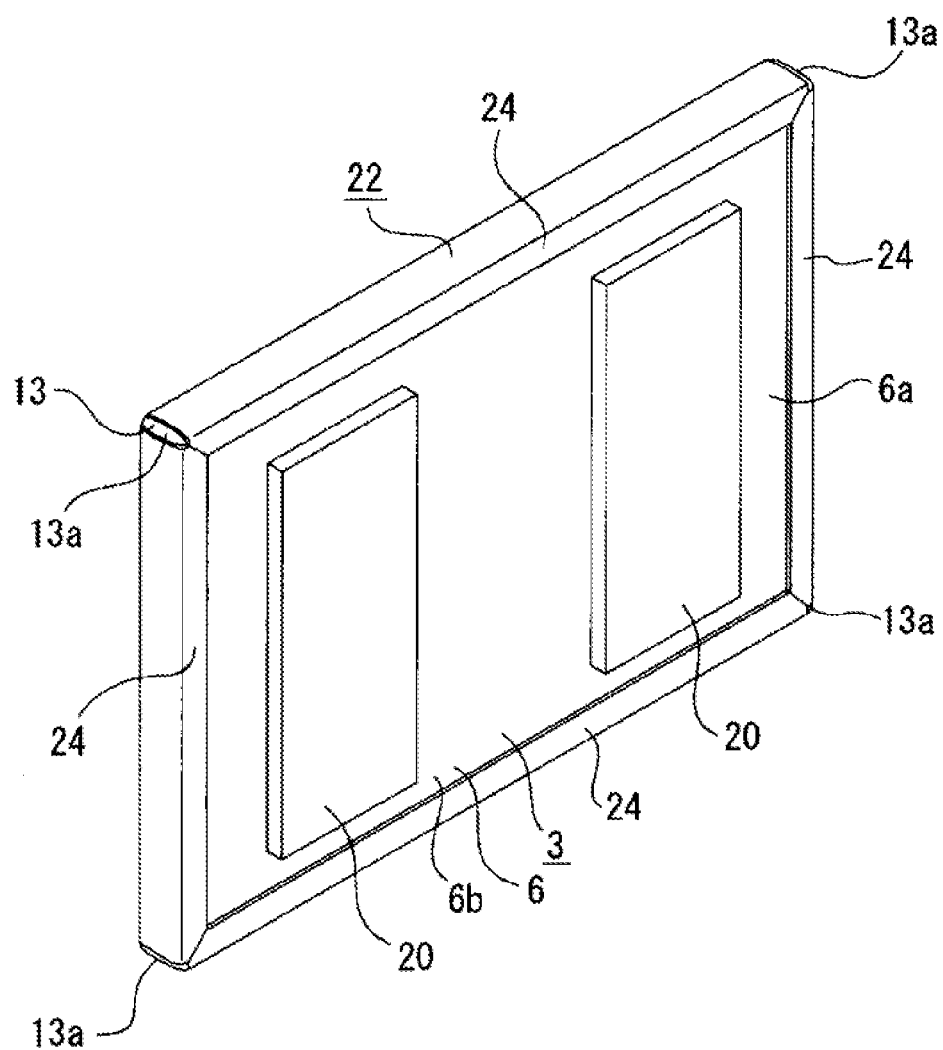
FIG. 12 is a schematic perspective view showing a state in which circuit boards are attached to the back chassis.

Next, the circuit boards 20 and 20 are mounted on the rear face 6*b* of the base face portion 6 in the back chassis 3 (refer to FIG. 12), and the circuit boards 20 and 20 are connected to the electrode parts 4*d* and 4*d*.

Figure 13:
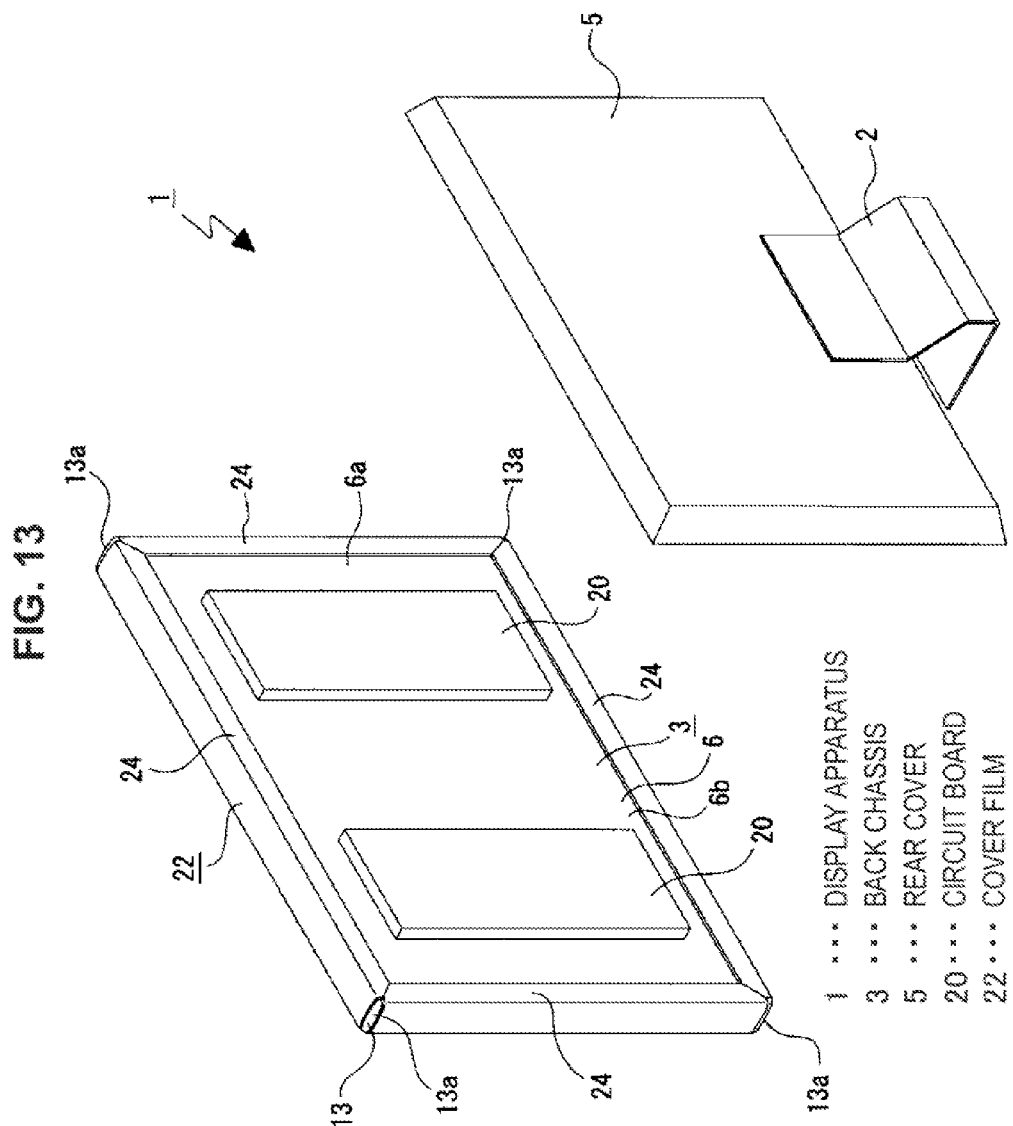
FIG. 13 is a schematic perspective view showing the state before a rear cover is mounted on the back chassis.

Finally, the rear cover 5 is mounted on the back chassis 3 using screwing or the like so that the display apparatus 1 is held by a stand 2, and accordingly, assembly work of the display apparatus 1 ends (refer to FIG. 13).

Note that the attachment of the auxiliary film 21 and the cover film 22 can also be performed using, for example, a double-sided tape, an adhesive, a mounting screw, or the like, in addition to an adhesive.

In addition, in the above description, the protective member 12 formed in a frame shape has been exemplified, but for example, there may be one side out or the four sides of the display which is not to be mounted on the protective member, and in such a case, the protective member is formed in a U shape, a straight line shape, or the like, rather than the frame shape.

[Other Configurations of the Cover Film, or the Like]

Next, other configurations of the cover film, or the like will be described (refer to FIGS. 14 to 17).

Figure 14:
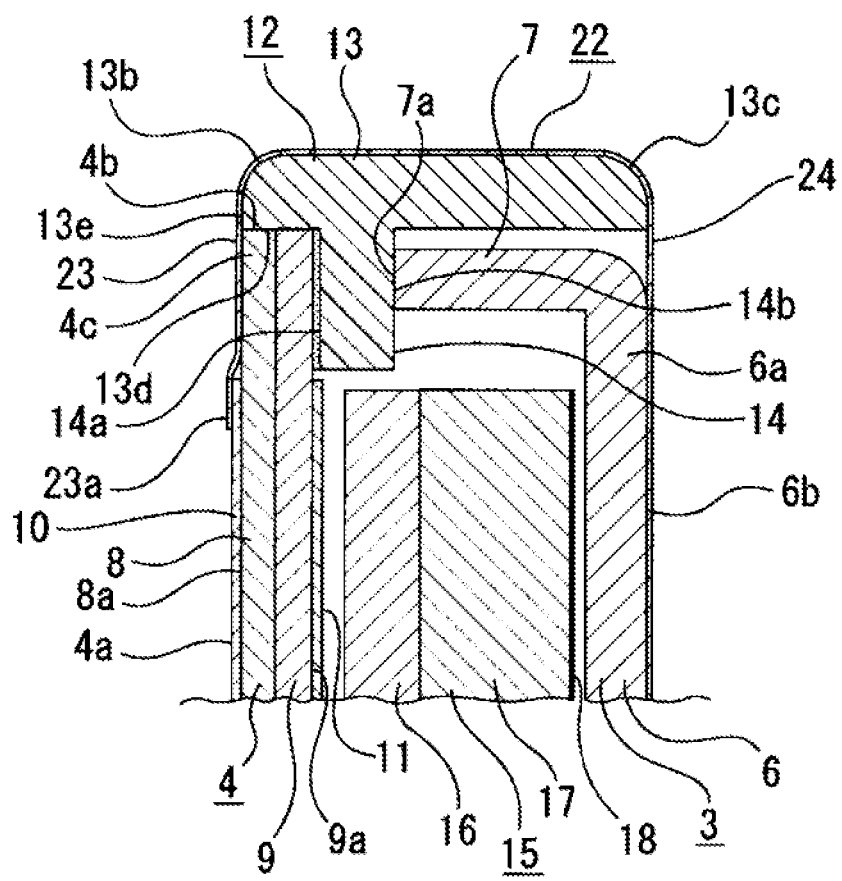
FIG. 14, along with FIGS. 15 to 17, is a diagram showing another configuration of the cover film, and the like, and the present drawing is an enlarged cross-sectional view showing an example in which an auxiliary film is not used.
Figure 15:
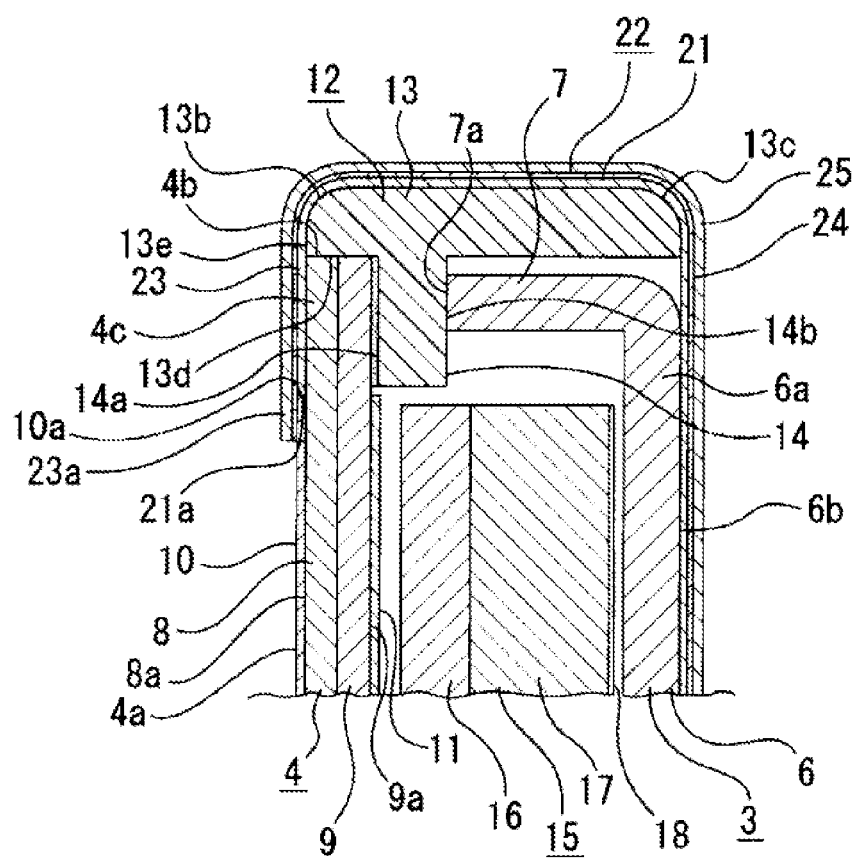
FIG. 15 is an enlarged cross-sectional view showing an example in which a reinforcing film is attached to the cover film.
Figure 16:
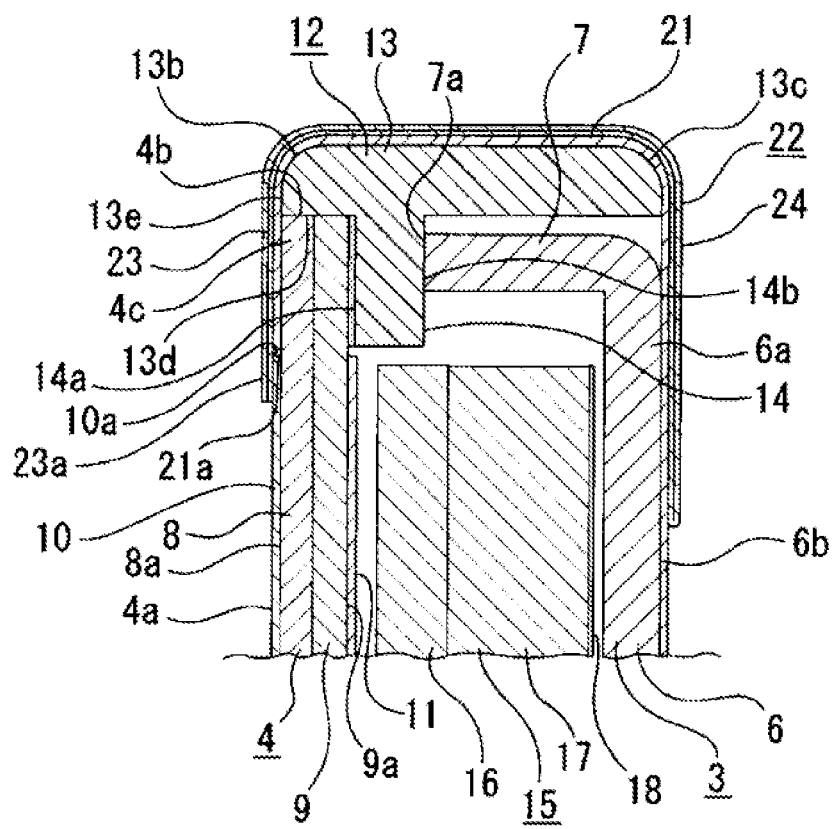
FIG. 16 is an enlarged cross-sectional view showing an example in which a folded cover film is used.

With regard to the display apparatus 1, a configuration in which the cover film 22 is attached to the display 4, the back chassis 3, or the like is possible without attaching the auxiliary film 21 thereto (refer to FIG. 14).

Using this configuration, since the auxiliary film 21 is not present, the display apparatus 1 can be further miniaturized and lightened in weight, and attachment work of the auxiliary film 21 is not necessary, which can simplify the assembly work of the display apparatus 1.

Figure 25:
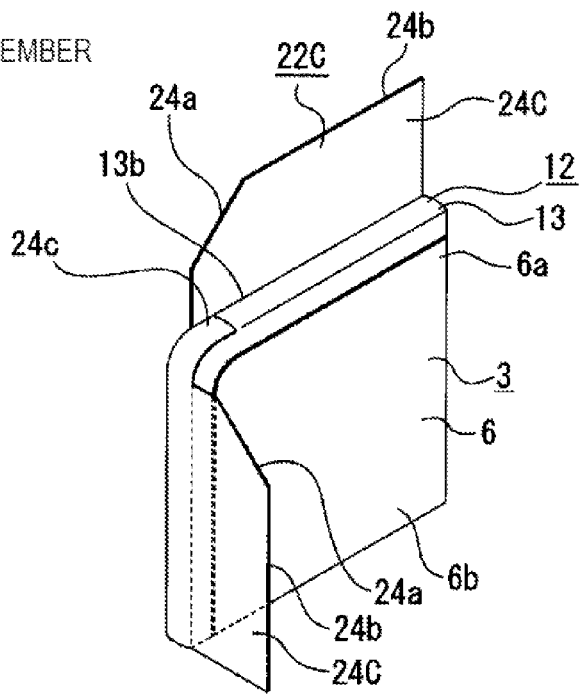
FIG. 25 is an enlarged perspective view showing a state in which one protruding face portion of the cover film is folded to be attached to the protective member in continuation of FIG. 24.
Figure 26:
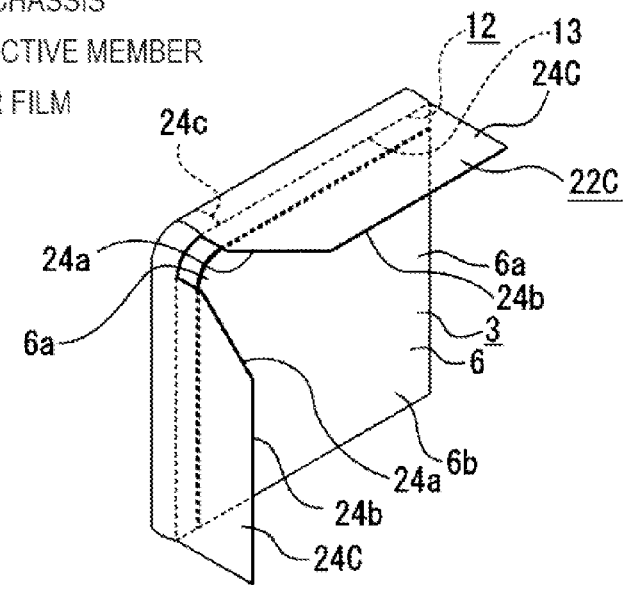
FIG. 26 is an enlarged perspective view showing a state in which a protruding face portion positioned adjacent to another folded protruding face portion is folded to be attached to the protective member in continuation of FIG. 25.
Figure 27:
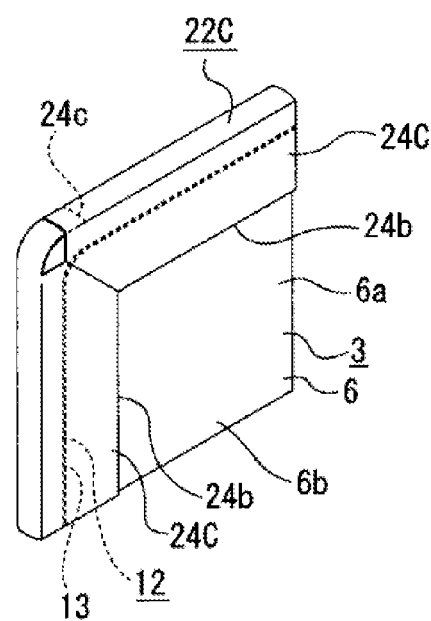
FIG. 27 is an enlarged perspective view showing a state in which the protruding face portions are folded and then attached to the back chassis in continuation of FIG. 26.

In addition, with regard to the display apparatus 1, a configuration in which a reinforcing film 25 is attached to the outer face of the cover film 22 is possible (refer to FIG. 25). Note that it is desirable for the reinforcing film 25 to have a thicker thickness and to be formed of a material having a higher mechanical strength than that of the cover film 22

Using this configuration, the strength of the cover film 22 is reinforced by the reinforcing film 25 so that not only breakage and damage but also detachment of the cover film 22 can be prevented.

Furthermore, with regard to the display apparatus 1, a configuration in which the cover film 22 is attached thereto in a state in which the film is turned down so as to be superimposed thereon (refer to FIG. 16) is possible. The number of times of turning down the film is arbitrary.

Using this configuration, rigidity of the cover film 22 increases, and accordingly, protection of the display 4 can be reinforced and a holding force exerted on the display 4 by the cover film 22 can improve.

Figure 17:
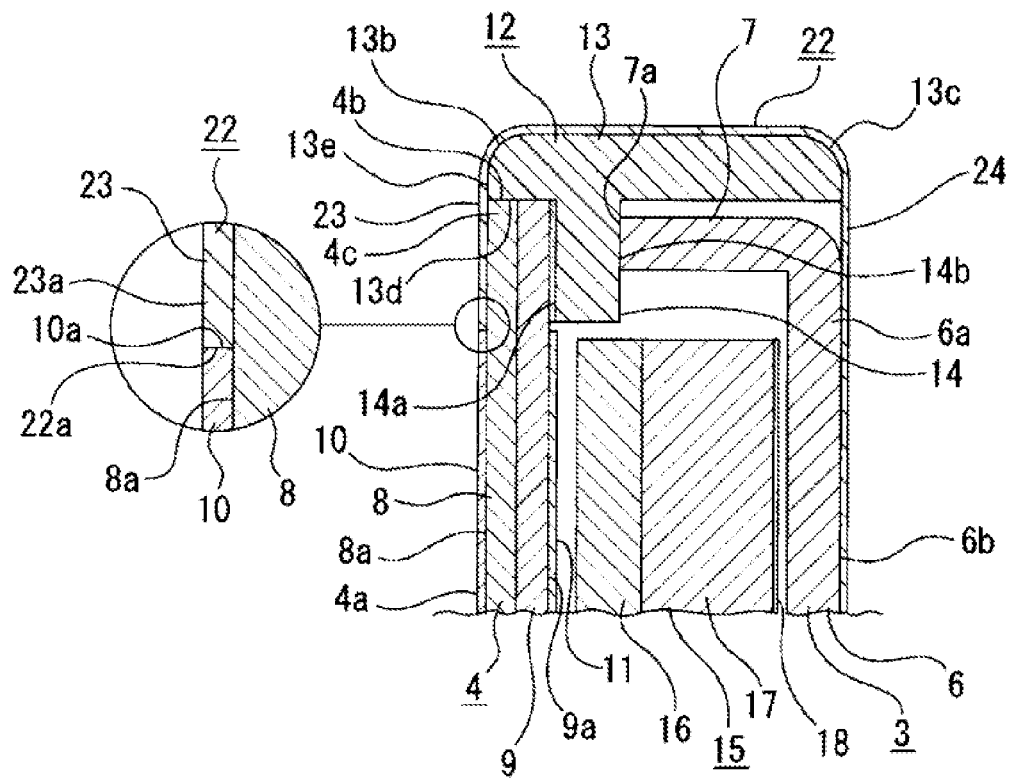
FIG. 17 is an enlarged cross-sectional view showing an example in which one end face of the cover film and an outer circumferential face of the first polarizing film butt each other.

Moreover, with regard to the display apparatus 1, a configuration in which the cover film 22 is attached to the display 4, the back chassis 3, and the like in a state in which one end face 22*a* of the cover film 22 having the same thickness as the first polarizing film 10 and the outer circumferential face 10*a* of the first polarizing film 10 abut each other is possible without attaching the auxiliary film 21 thereto (refer to FIG. 17).

Using this configuration, since the auxiliary film 21 is not present and the cover film 22 is not superimposed on the first polarizing film 10, the display apparatus 1 can be further miniaturized and lightened in weight, and since there is no level difference occurring between the first polarizing film 10 and the cover film 22, enhancement in design of the display apparatus 1 can be attained.

Next, display apparatuses 1A and 1B having different configurations in which the size of the cover film is changed will be described (refer to FIGS. 18 to 23).

Figure 18:
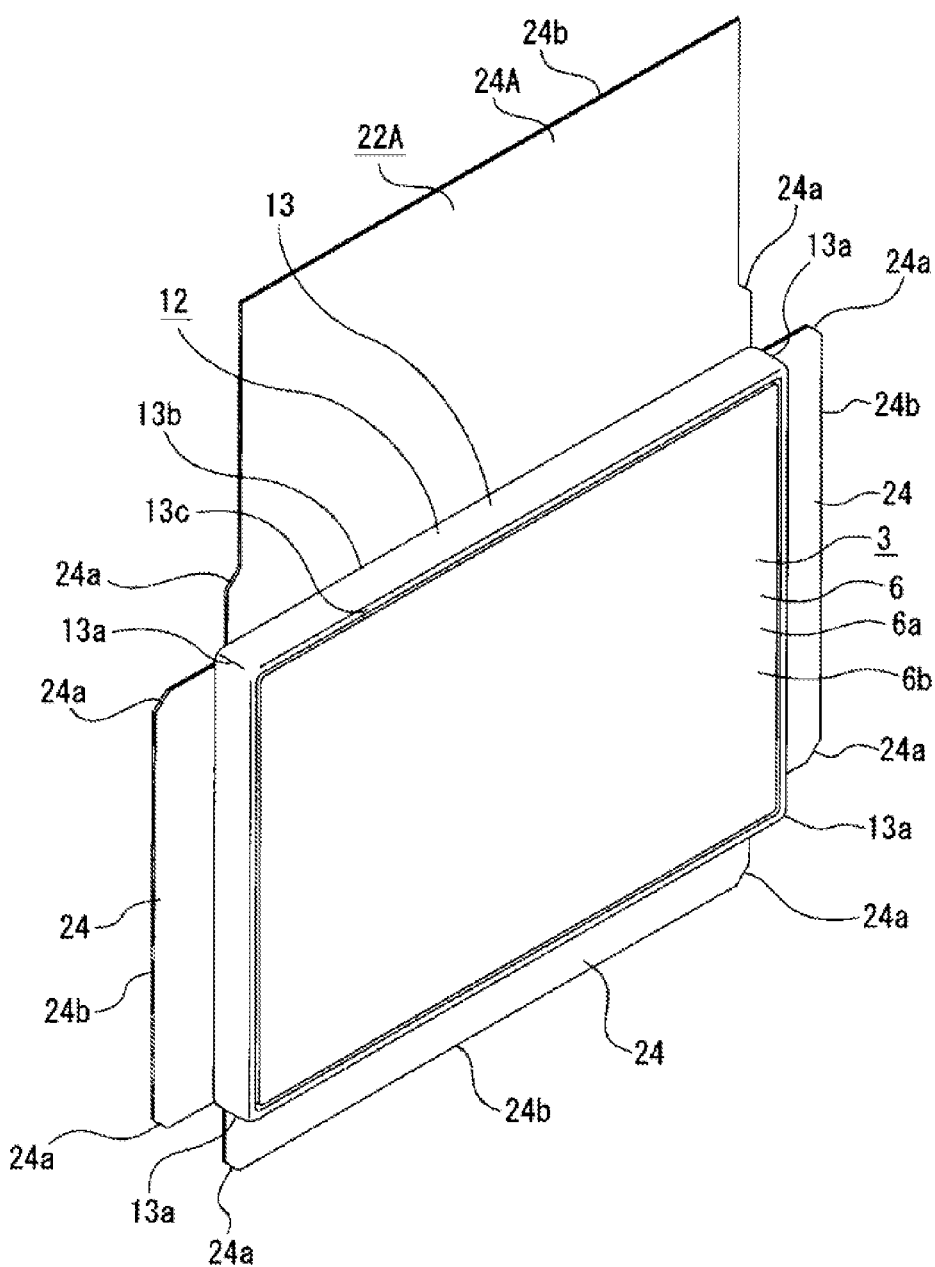
FIG. 18, along with FIGS. 19 and 20, is a diagram showing an example of the display apparatus having another configuration in which the size of the cover film is changed, and the present drawing is a schematic perspective view showing a state in which the front face attaching portion of the cover film is attached to the display.
Figure 19:
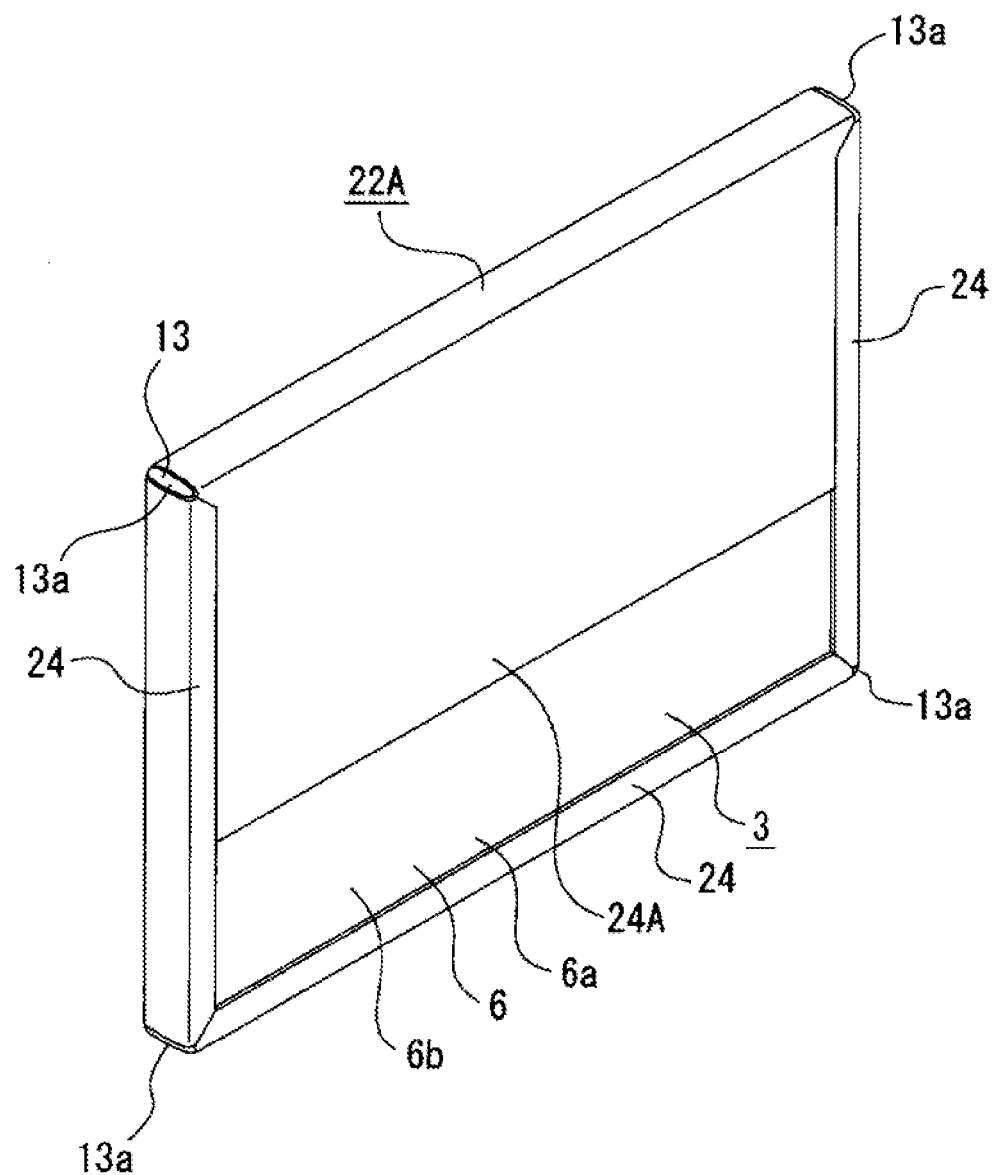
FIG. 19 is a schematic perspective view showing a state in which the cover film is folded and attached to the protective member and the back chassis in continuation of FIG. 18.
Figure 20:
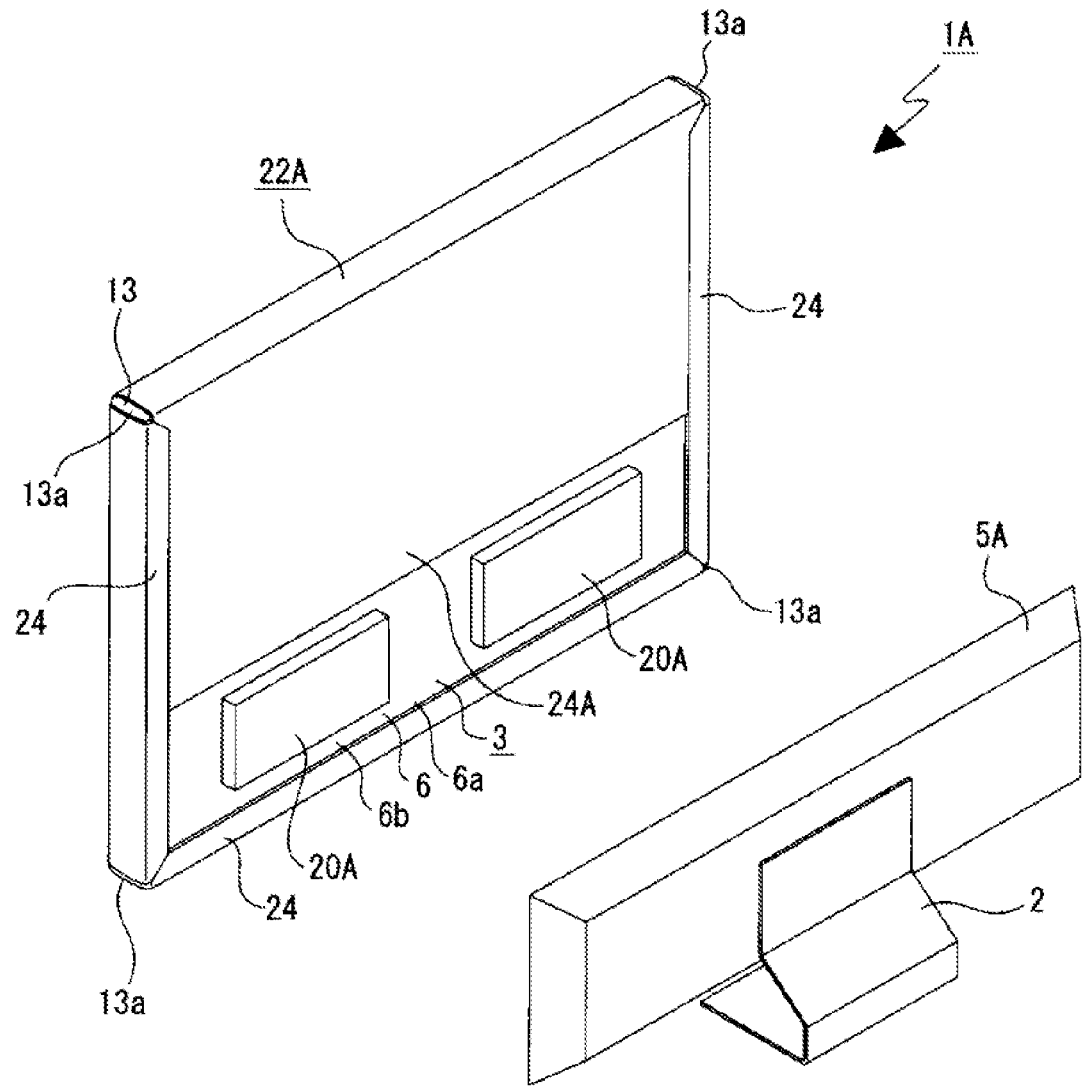
FIG. 20 is a schematic perspective view showing the state before the rear cover is mounted on the back chassis in continuation of FIG. 19.

In the display apparatus 1A, a cover film 22A having a different size from the cover film 22 is attached to the display 4, the back chassis 3, and the like (refer to FIGS. 18 to 20).

The cover film 22A is formed such that, for example, a protruding face portion 24A thereof that is positioned on the upper side of the film is formed to be longer than other protruding face portions 24, 24, and 24.

In the state in which the protruding face portions 24A, 24, . . . are folded so as to be attached to the protective member 12 and the back chassis 3, the protruding face portion 24A is attached to the portion other than the portion of the base face portion 6 on the lower end side of the back chassis 3 (refer to FIG. 19).

Small-sized circuit boards 20A and 20A are mounted on the portion of the base face portion 6 on the lower end side, and the rear cover 5A is mounted on the portion of the base face portion 6 on the lower end side so as to close the circuit boards 20A and 20A (refer to FIG. 20).

Using this configuration, the rear cover 5A of the display apparatus 1A can be miniaturized, and accordingly, miniaturization, light weight, and reduction of manufacturing costs of the display apparatus 1A can be attained.

Figure 21:
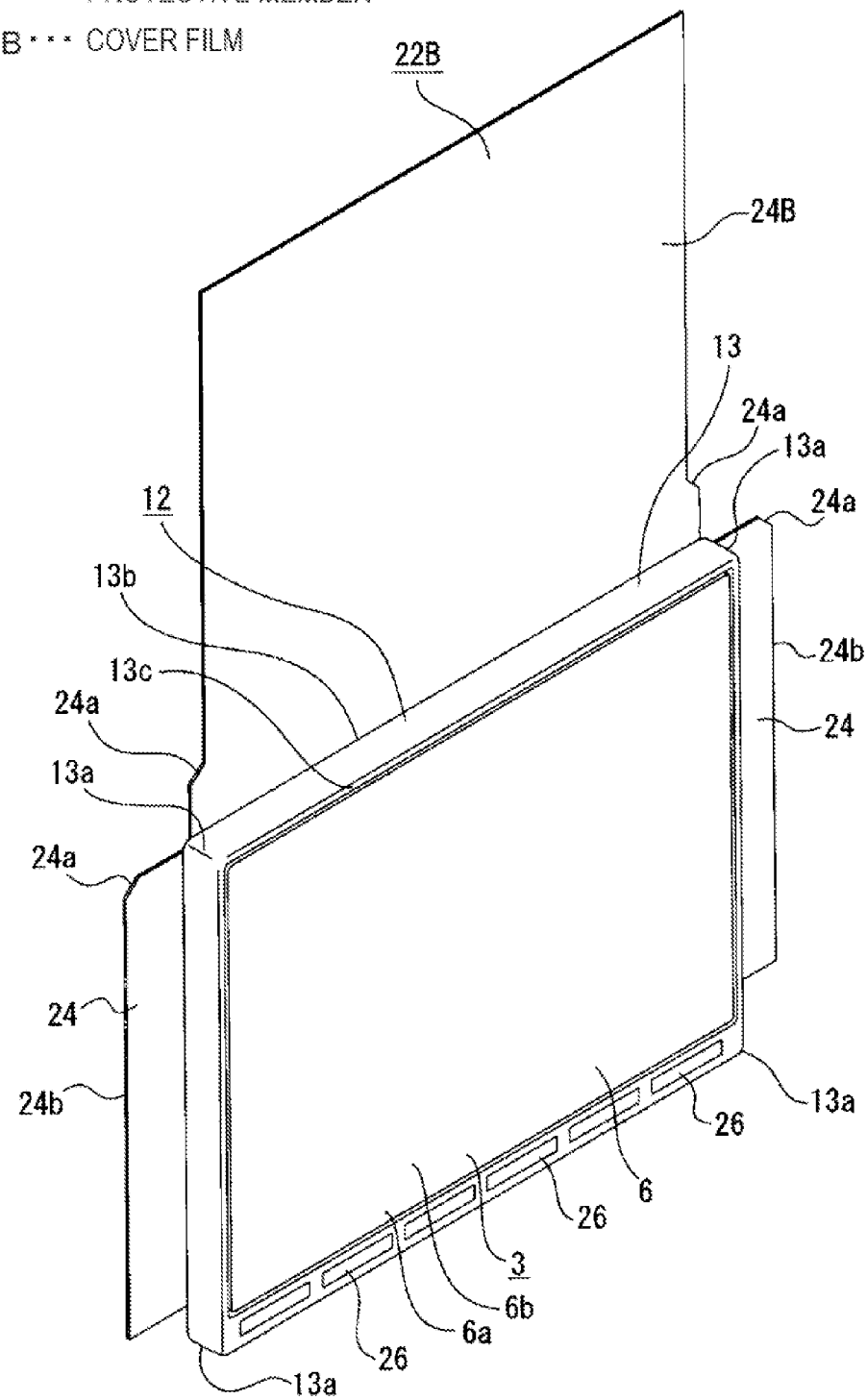
FIG. 21, along with FIGS. 22 and 23, is a diagram showing another example of the display apparatus having still another configuration in which the size of the cover film is changed, and the present drawing is a schematic perspective view showing a state in which the front face attaching portion of the cover film is attached to the display.
Figure 22:
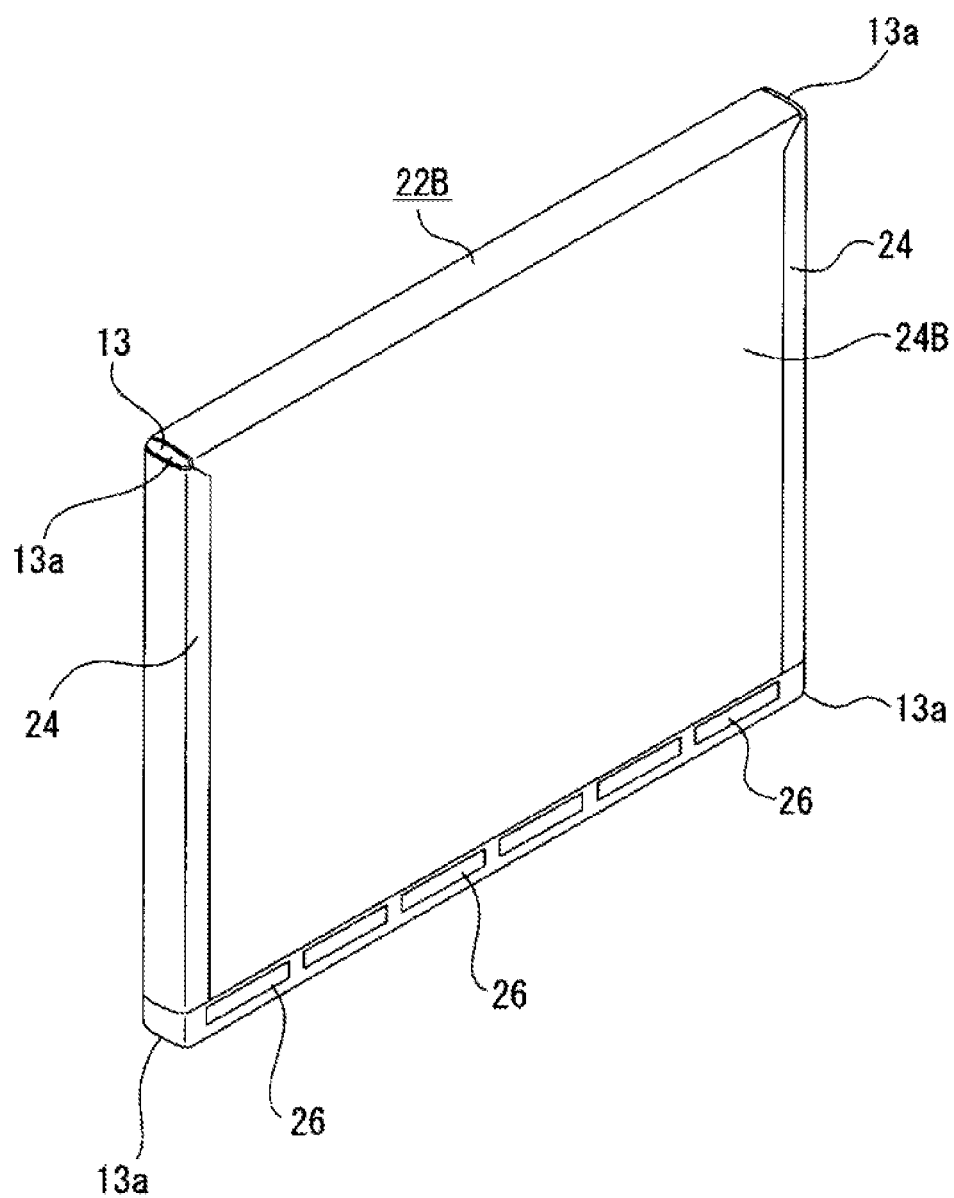
FIG. 22 is a schematic perspective view showing a state in which the cover film is folded and attached to the protective member and the back chassis in continuation of FIG. 21.
Figure 23:
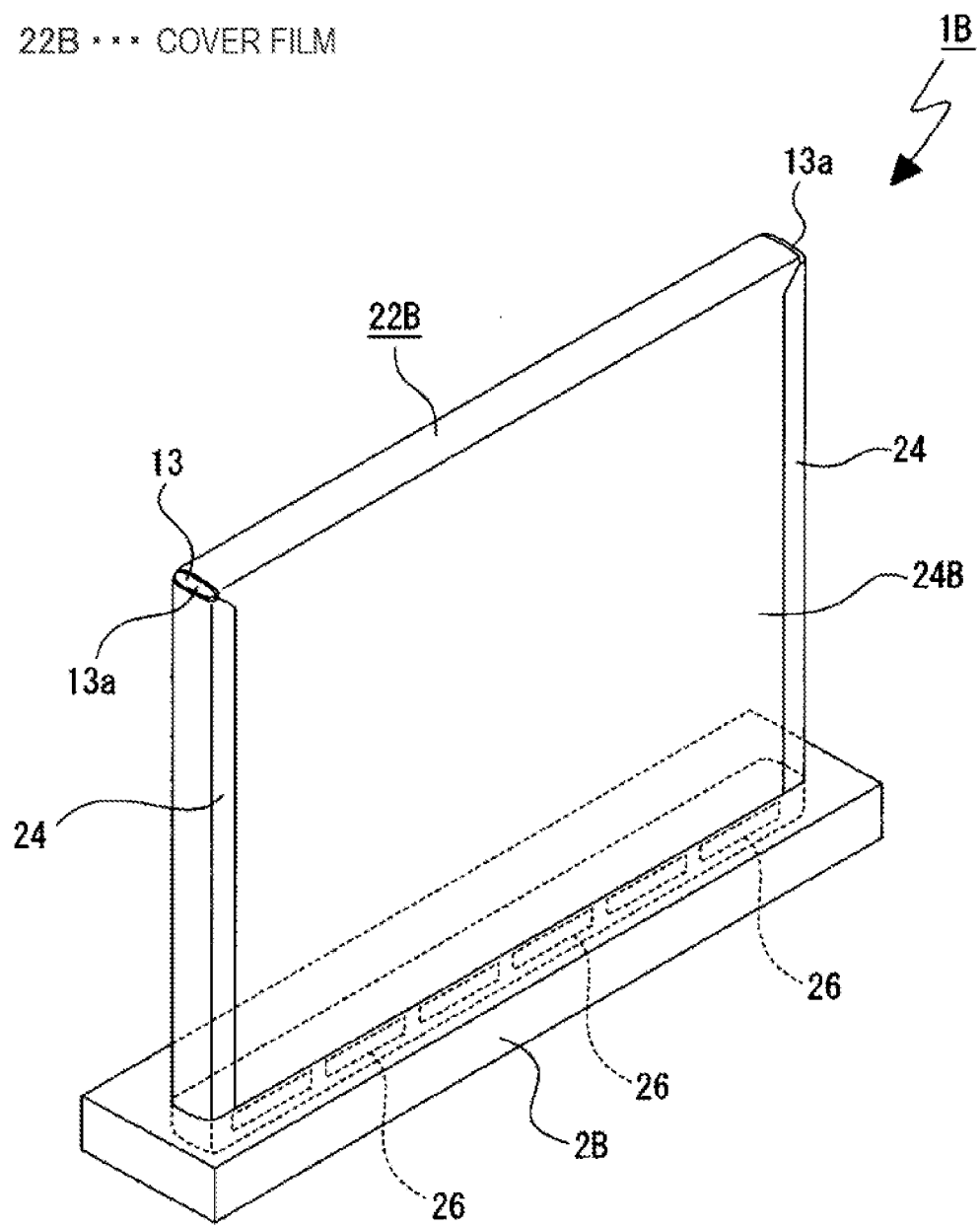
FIG. 23 is a schematic perspective view showing a state in which the display apparatus is held by a stand in continuation of FIG. 22.
Figure 24:
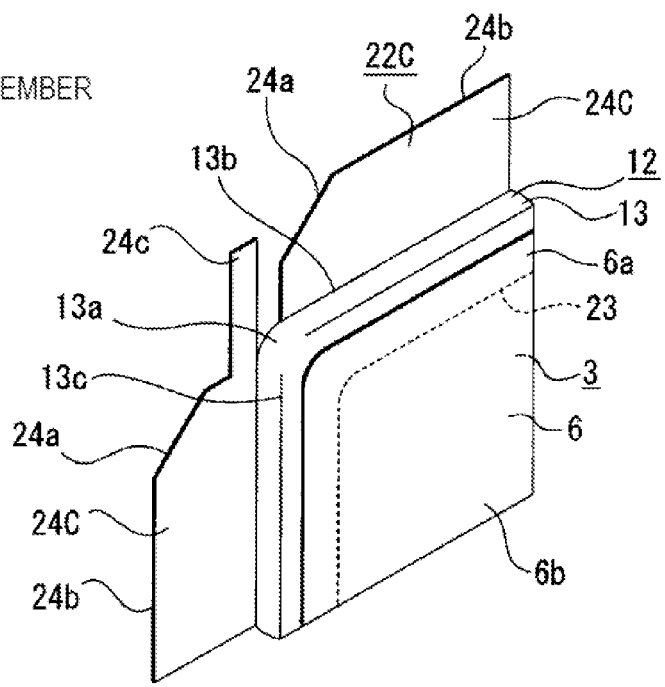
FIG. 24, along with FIGS. 25 to 27, is a diagram showing still another configuration in which the shape of the cover film is changed, and the present drawing is an enlarged perspective view showing a state in which the front face attaching portion of the cover film is attached to the display.

In the display apparatus 1B, a cover film 22B having a different size from the cover film 22 is attached to the display 4, the back chassis 3, and the like (refer to FIGS. 21 to 23).

The cover film 22B is formed such that, for example, a protruding face portion 24B thereof that is positioned on the upper side of the film is formed to be longer than other protruding face portions 24, and 24, and the protruding face portion 24B is formed to be longer than the protruding face portion 22A of the cover film 22A. The cover film 22B may not be provided with the protruding face portion 24 that is positioned on the lower side thereof.

In the state in which the protruding face portions 24B, 24, and 24 are folded so as to be attached to the protective member 12 and the back chassis 3, the protruding face portion 24B is attached to the portion other than the lower end of the base face portion 6 of the back chassis 3 (refer to FIG. 22).

The connection terminals 26, 26, . . . are provided in the lower end of the base face portion 6.

The display apparatus 1B is held by a stand 2B in which a circuit board not shown in the drawing is disposed (refer to FIG. 23). The stand 2B is formed to be a horizontally long box shape of which the upper part is open.

The display apparatus 1B is held such that the lower end thereof is inserted into the stand 2B, and the connection terminals 26, 26, . . . are connected to each terminal part of the circuit board.

Using this configuration, a rear cover is not necessary for the display apparatus 1B, and miniaturization, light weight, and reduction of manufacturing costs of the display apparatus 1B can be attained.

In addition, since a rear cover is not disposed on the back face side of the back chassis 3, a thin shape and enhancement in design of the display apparatus 1B can be attained.

Next, another configuration in which the shape of the cover film is changed will be described (refer to FIGS. 24 to 27).

In the display apparatus 1, a cover film 22C can be used instead of the cover film 22.

Concealing parts 24c, 24c, . . . are provided in each of protruding face portions 24C, 24C, . . . of the cover film 22C. Each of the concealing parts 24c is provided to protrude along the side edge of the protruding face portion 24C that is positioned adjacent thereto, and formed to have substantially the same width as the protective member 12 (refer to FIG. 24).

One protruding face portion 24C is first folded so that the cover film 22C is attached to the outer face of the protective member 12 (refer to FIG. 25). Here, one concealing part 24c thereof is attached to a first corner part 13a of the protective member 12.

Next, another protruding face portion 24C positioned adjacent to the protruding face portion 24C that was folded is folded to be attached to the outer face of the protective member 12, and the concealing part 24c of the second folded protruding face portion 24C is attached to a second corner part 13a of the protective member 12. Here, the second folded protruding face portion 24C is superimposed on the concealing part 24c that was attached to the first corner part 13a beforehand from the outer side (refer to FIG. 26).

Thereafter, another protruding face portion 24C positioned adjacent to the second folded protruding face portion 24C is folded to be attached to the outer face of the protective member 12, and the concealing part 24c of the third folded protruding face portion 24C is attached to a third corner part 13a of the protective member 12 in order.

Then, all of the protruding face portions 24C are folded to be attached to the back face 6b of the base face portion 6 of the back chassis 3 (refer to FIG. 27), and then attachment work of the cover film 22C ends.

Using such a cover film 22C, the four corner parts 13a, 13a, . . . of the protective member 12 can be configured not to be exposed, and accordingly, enhancement in design of the display apparatus 1 can be attained.

[Conclusion]

As described above, in the display apparatuses 1, 1A, and 1B, the cover films 22, 22A, 22B, and 22C are attached to at least one part of the outer circumferential portion 4c of the display 4 in the state in which the films reach the back chassis 3 from the display face 4a side of the display 4, and the display 4 is held by the cover films 22, 22A, 22B, and 22C.

Thus, it is not necessary to provide a frame body which is called a bezel to hold the display 4, so the outer shape and weight thereof decrease, and accordingly, miniaturization and light weight can be attained.

In addition, since there is no level difference occurring between a bezel in a case in which the bezel is provided and a display face of the bezel, enhancement in design of the display apparatus 1 can be attained.

Furthermore, there are cases in which a transparent plate-like member (front face plate), for example, glass, or the like is disposed instead of a bezel so as not to generate a level difference, but since a front face plate is not necessary to be disposed in the display apparatuses 1, 1A, and 1B, a thin shape, a light weight, and reduction in manufacturing costs can be attained due to a reduction in the number of components.

Note that printing on the surfaces of the cover films 22, 22A, 22B, and 22C may be performed, and in such a case, desired colors and texture can be expressed, and accordingly, enhancement in design of the display apparatus 1 can be attained.

Furthermore, since the cover films 22, 22A, 22B, and 22C are attached to the outer circumferential portion 4c of the display 4 and the back chassis 3, the display 4 is linked to the back chassis 3 via the cover films 22, 22A, 22B, and 22C, and the display 4 can be easily and reliably held by the cover films 22, 22A, 22B, and 22C.

In addition, since the protective member 12 is provided in the outer circumferential portion 4c of the display 4, and the cover films 22, 22A, 22B, and 22C are attached to the outer face of the protective member 12, the display 4 can be held by the cover films 22, 22A, 22B, and 22C in the state in which the outer circumferential portion 4c thereof is protected.

Additionally, the present technology may also be configured as below.

(1) A display apparatus including:

a display that has a display face on which an image is displayed;

a back chassis that is disposed on a side opposite to the display face of the display; and a cover film that is positioned in a state in which the cover film reaches the back chassis from the display face, one end of the cover film being attached to at least a portion of an outer circumferential portion of the display, wherein the display is held by the cover film.

(2) The display apparatus according to (1), wherein at least another end of the cover film is attached to the back chassis.

(3) The display apparatus according to (2), wherein a circuit board and a rear cover that closes the circuit board are mounted on the back chassis, and wherein a portion of the cover film that is attached to the back chassis is pressed by the rear cover.

(4) The display apparatus according to any one of (1) to (3), wherein the display is provided with a display panel and a polarizing film attached to a surface of the display panel, and wherein the polarizing film is used as the cover film.

(5) The display apparatus according to any one of (1) to (4), wherein a protective member that covers at least a portion of an outer circumferential face of the display is provided, and wherein the cover film is attached to an outer face of the protective member.

(6) The display apparatus according to any one of (1) to (5), wherein the display is provided with a display panel and a polarizing film attached to a surface of the display panel, and wherein one end of the cover film is attached to at least a portion of an outer circumferential portion of the polarizing film.

(7) The display apparatus according to any one of (1) to (6),
wherein the display is provided with a display panel and a polarizing film attached to a surface of the display panel, and
wherein at least a portion of an outer circumferential face of the polarizing film abuts one end face of the cover film.

(8) The display apparatus according to any one of (1) to (7), wherein a reinforcing film is attached to the cover film.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising:
   a display that has a display face on which an image is displayable; and
   a back chassis that is disposed on a side opposite to the display face of the display, the back chassis includes a base face portion having a front side which faces frontward toward the display face and a rear side which faces rearward away from the display face such that rear side of the base face portion is substantially parallel to the display face;
   the display having a polarizing film which extends from the display face to a part of the rear side of the base face portion of the back chassis and is configured to hold the display, and
   the polarizing film being arranged as the display face so as to form thereat an outermost surface of the display in which the display is held by the polarizing film.

2. A display apparatus comprising:
   a display that has a display face on which an image is displayable; and
   a back chassis that is disposed on a side opposite to the display face of the display; and
   the display having a polarizing film which extends from the display face to the back chassis and is configured to hold the display, and
   polarizing film being arranged as the display face so as to form thereat an outermost surface of the display in which the display is held by the polarizing film,
   wherein at least another end of the polarizing film is attached to the back chassis
   wherein a circuit board and a rear cover that closes the circuit board are mounted on the back chassis, and
   wherein a portion of the polarizing film that is attached to the back chassis is pressed by the rear cover.

3. The display apparatus according to claim 1,
   wherein a protective member that covers at least a portion of an outer circumferential face of the display is provided, and
   wherein the polarizing film is attached to an outer face of the protective member.

* * * * *